(12) United States Patent
Lee et al.

(10) Patent No.: US 10,248,827 B2
(45) Date of Patent: Apr. 2, 2019

(54) INTERFERENCE-FREE FINGERPRINT IDENTIFICATION DEVICE

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 112 days.

(21) Appl. No.: 15/654,012

(22) Filed: Jul. 19, 2017

(65) Prior Publication Data

US 2018/0025203 A1 Jan. 25, 2018

(30) Foreign Application Priority Data

Jul. 20, 2016 (TW) .............................. 105122817 A

(51) Int. Cl.
| | | |
|---|---|---|
| *G06K 9/00* | (2006.01) | |
| *G06F 3/041* | (2006.01) | |
| *G06F 3/044* | (2006.01) | |
| *G07C 9/00* | (2006.01) | |
| *H01L 27/12* | (2006.01) | |
| *H01L 27/146* | (2006.01) | |

(52) U.S. Cl.
CPC ......... *G06K 9/00013* (2013.01); *G06F 3/044* (2013.01); *G06F 3/0418* (2013.01); *G07C 9/00158* (2013.01); *H01L 27/1214* (2013.01); *H01L 27/14678* (2013.01)

(58) Field of Classification Search
CPC ... G06K 9/00013; G06F 3/0418; G06F 3/044; G07C 9/00158; H01L 27/1214; H01L 27/14678
See application file for complete search history.

(56) References Cited

U.S. PATENT DOCUMENTS

| | | | | | |
|---|---|---|---|---|---|
| 5,325,442 | A | * | 6/1994 | Knapp | .................... G01B 7/004 361/278 |
| 5,952,588 | A | * | 9/1999 | Young | ..................... G06F 3/044 73/777 |
| 5,973,623 | A | * | 10/1999 | Gupta | .................. H03K 17/962 307/116 |

(Continued)

*Primary Examiner* — Manav Seth
(74) *Attorney, Agent, or Firm* — Muncy, Geissler, Olds & Lowe, P.C.

(57) ABSTRACT

An interference-free fingerprint identification device includes a TFT substrate, a TFT layer having plural TFTs, a sensing electrode layer having plural fingerprint sensing electrodes, a gate line layer having plural gate lines, a data line layer having plural data lines, and a first shielding layer. Each fingerprint sensing electrode corresponds to a plurality of the TFTs, and is connected to sources or drains of at least two corresponding TFTs. At least two gate lines are electrically connected to gates of a plurality of the TFTs corresponding to a fingerprint sensing electrode. Each data line is electrically connected to a source or drain of a TFT in a plurality of the TFTs corresponding to a fingerprint sensing electrode. The first shielding layer is electrically connected to a source or drain of a TFT in a plurality of the TFTs corresponding to each fingerprint sensing electrode.

16 Claims, 19 Drawing Sheets

(56) References Cited

U.S. PATENT DOCUMENTS

| | | | | |
|---|---|---|---|---|
| 5,978,496 | A * | 11/1999 | Harkin | G01B 7/004 |
| | | | | 382/124 |
| 6,011,859 | A * | 1/2000 | Kalnitsky | G06K 9/00053 |
| | | | | 382/100 |
| 6,108,438 | A * | 8/2000 | Bird | G06K 9/0002 |
| | | | | 250/556 |
| 6,225,711 | B1 * | 5/2001 | Gupta | H03K 17/962 |
| | | | | 307/125 |
| 6,657,175 | B2 * | 12/2003 | Yoon | H01L 27/12 |
| | | | | 250/208.1 |
| 7,795,062 | B2 * | 9/2010 | Taussig | G06K 9/0002 |
| | | | | 257/415 |
| 9,490,312 | B2 * | 11/2016 | Lee | H01L 27/3276 |
| 9,847,506 | B2 * | 12/2017 | Lee | H01L 51/5253 |
| 9,880,688 | B2 * | 1/2018 | Akhavan Fomani | G06F 3/044 |
| 9,916,490 | B2 * | 3/2018 | Lee | G06K 9/0002 |
| 9,946,375 | B2 * | 4/2018 | Akhavan Fomani | G06F 3/041 |
| 9,958,993 | B2 * | 5/2018 | Akhavan Fomani | G06F 3/044 |
| 10,048,795 | B2 * | 8/2018 | Lee | G06F 3/0416 |
| 2006/0134922 | A1 * | 6/2006 | Taussig | H01L 27/1214 |
| | | | | 438/739 |
| 2015/0091850 | A1 * | 4/2015 | Morein | G06F 3/0412 |
| | | | | 345/174 |
| 2015/0177868 | A1 * | 6/2015 | Morein | G06F 3/044 |
| | | | | 345/174 |

\* cited by examiner

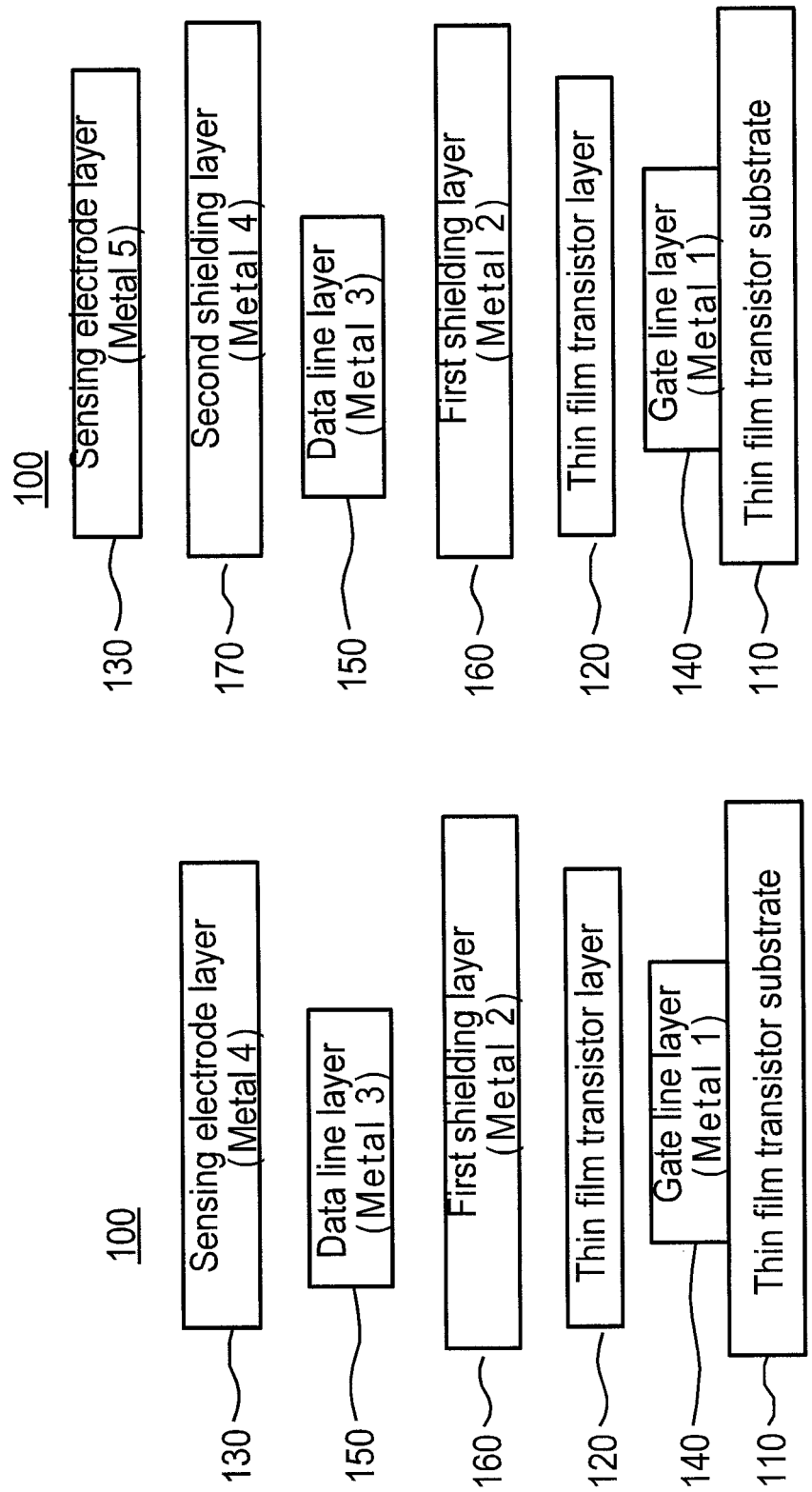

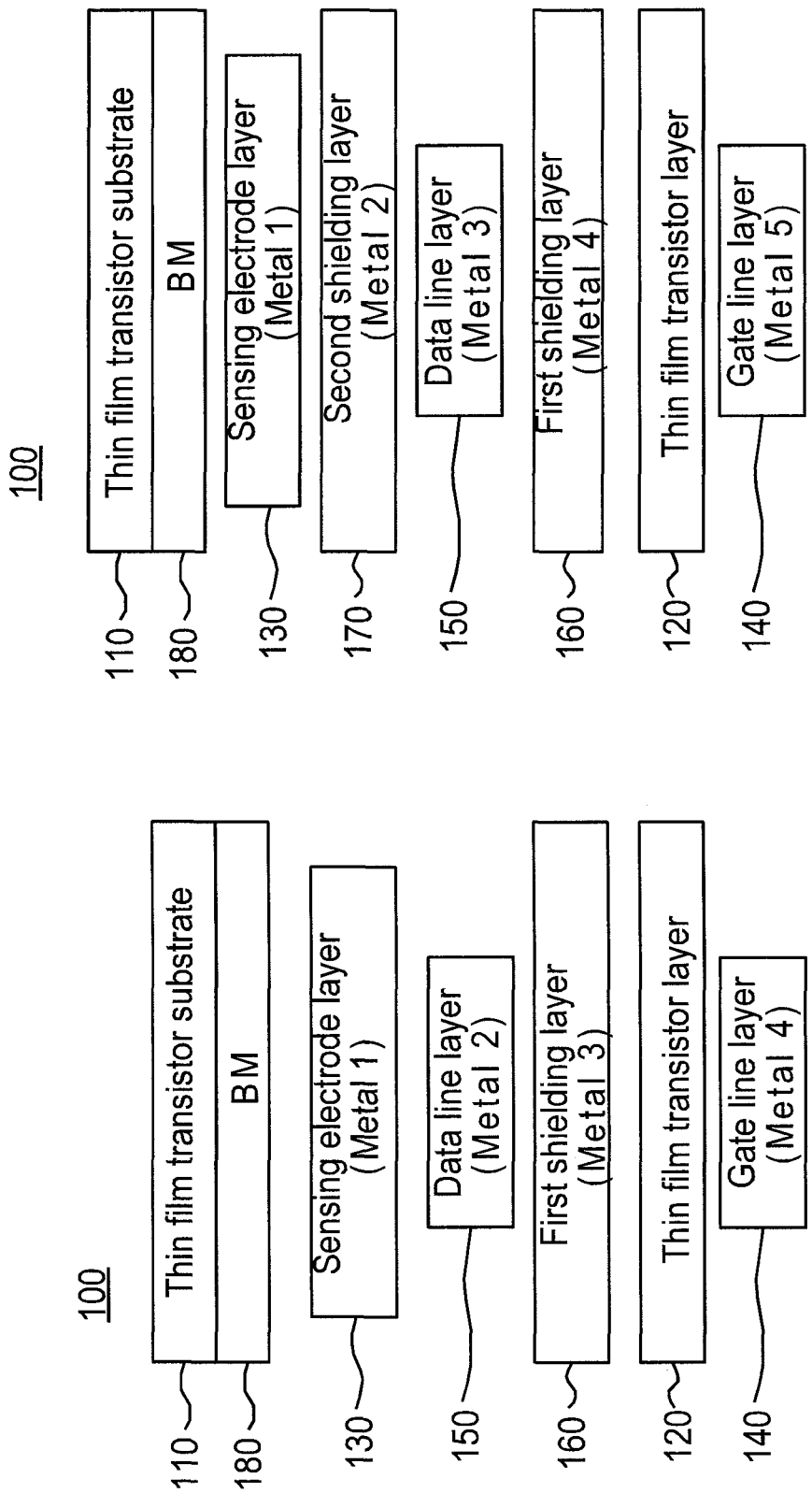

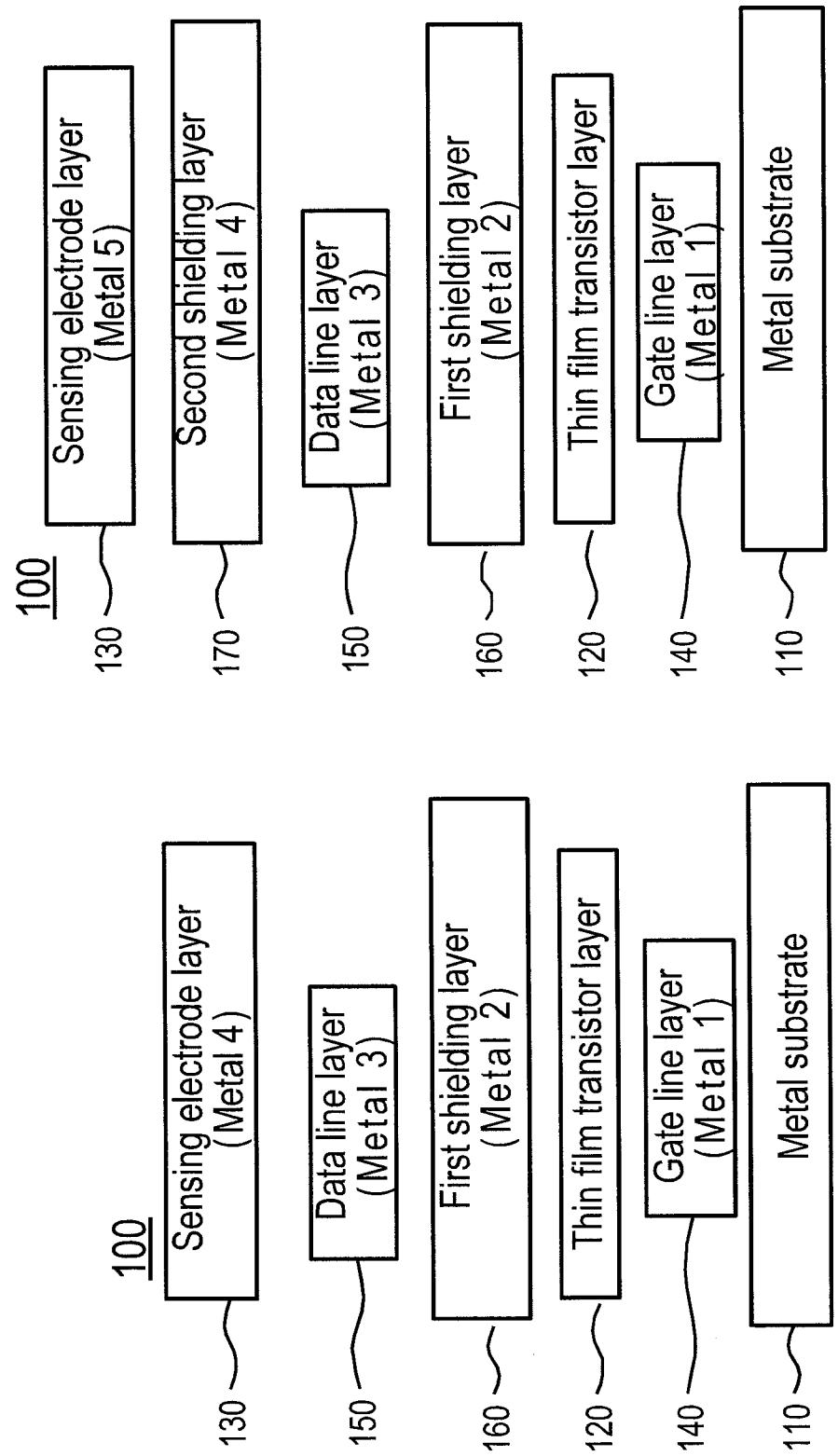

INTERFERENCE-FREE FINGERPRINT IDENTIFICATION DEVICE

BACKGROUND OF THE INVENTION

1. Field of the Invention

The present invention relates to the technical field of fingerprint identification and, more particularly, to an interference-free fingerprint identification device.

2. Description of Related Art

Due to the rising of e-commerce, the development of remote payment is dramatically increasing, so that the business demands for the biometrics are also rapidly expanded. The biometrics technology can be divided into the fingerprint identification technology, the iris identification technology, the DNA identification technology, and so on. In order to satisfy the requirements of efficiency, safety, and non-invasiveness, the fingerprint identification technology has become the preferred technology for the biometrics technology. The fingerprint identification technology can be divided into the optical identification, the thermal induction identification, the ultrasonic identification, and the capacitive identification. In consideration of the device size, cost, power consumption, reliability and security, the capacitive identification technology is the outstanding choice.

For the typical capacitive fingerprint identification technology, there are a sweep type fingerprint identification and a press type fingerprint identification, wherein the press type fingerprint identification has a better performance in the recognition, efficiency and convenience. However, due to that the sensing signal is extremely small and the surrounding noise is huge and complicated, the sensing electrodes and the sensing circuit are packaged in one integrated circuit (IC) chip for the press type fingerprint identification. To prevent the lead lines of the fingerprint identification IC chip package from damage, epoxy resin is applied to protect the lead lines, resulting in adding a distance with several tens of micrometers (μm) between the sensing electrodes and the finger, which dramatically reduces the sensitivity of the fingerprint identification. Therefore, it needs an expensive sapphire film with high dielectric coefficient to reduce the distance between the sensing electrodes and the finger so as to increase the sensitivity. In addition, due to addition of this distance with several tens of micrometers (μm), it also increases the difficulty of product integration. To solve the problems, it is a common practice to make an opening in the protection glass, and arrange the fingerprint identification chip that is packaged as a button type in the opening with a complicated mechanism. However, this is not only increasing the material cost and the package process cost, but also decreasing the product yield and the product lifetime and reliability. Therefore, it is desired to improve the sensitivity and signal noise ratio (SNR) for increasing the effective sensing distance as much as possible and also simplifying the package structure of the sensor circuit so as to significantly reduce the manufacturing cost and improve the product lifetime and reliability.

Therefore, it is desirable to provide an interference-free fingerprint identification device to mitigate and/or obviate the aforementioned problems.

SUMMARY OF THE INVENTION

The object of the present invention is to provide an interference-free fingerprint identification device, which has the advantages of low cost and simple package. In the interference-free fingerprint identification device, thin film transistors are used to form a thin film transistor layer on a substrate, wherein the thin film transistor layer is disposed on one side of the substrate and includes plural thin film transistors. A sensing electrode layer is provided with plural fingerprint sensing electrodes, each corresponding to at least three thin film transistors, and the sensing electrode is connected to the sources or drains of the corresponding thin film transistors. A gate line layer is provided with plural gate lines. A data line layer is provided with plural data lines. A first shielding layer is disposed between the gate line layer and the data line layer, and is electrically connected to a source or drain of a thin film transistor in a plurality of the thin film transistors. The interference-free fingerprint identification device is further provided with a fingerprint identification integrated circuit chip which is electrically connected to the thin film transistor substrate. Accordingly, it not only reduces chip area and simplifies the package process, but also easily increases the sensing area and facilitates the realization of curved surface sensing. Moreover, it can also enhance the accuracy of biometrics, significantly improve the manufacturing yield, and greatly reduce the manufacturing cost.

To achieve the object, there is provided an interference-free fingerprint identification device, which includes: a thin film transistor substrate, a thin film transistor layer, a sensing electrode layer, a gate line layer, a data line layer, and a first shielding layer. The thin film transistor layer is disposed on one side of the thin film transistor substrate and includes plural thin film transistors. The sensing electrode layer includes plural fingerprint sensing electrodes, wherein each fingerprint sensing electrode corresponds to a plurality of the thin film transistors, and is connected to sources or drains of at least two corresponding thin film transistors. The gate line layer includes plural gate lines, wherein at least two gate lines are electrically connected to gates of a plurality of the thin film transistors corresponding to a fingerprint sensing electrode. The data line layer includes plural data lines, wherein each data line is electrically connected to a source or drain of a thin film transistor in a plurality of the thin film transistors corresponding to a fingerprint sensing electrode. The first shielding layer is disposed between the gate line layer and the data line layer, and electrically connected to a source or drain of a thin film transistor in a plurality of the thin film transistors corresponding to each fingerprint sensing electrode.

BRIEF DESCRIPTION OF THE DRAWINGS

FIG. 2A and FIG. 2B are cross-sectional views of the interference-free fingerprint identification device in accordance with a first embodiment of the present disclosure;

FIG. 3A and FIG. 3B are another cross-sectional views of the interference-free fingerprint identification device in accordance with a first embodiment of the present disclosure;

FIG. 5A and FIG. 5B are yet another cross-sectional views of the interference-free fingerprint identification device in accordance with a first embodiment of the present disclosure;

DETAILED DESCRIPTION OF THE PREFERRED EMBODIMENT

Figure 1:
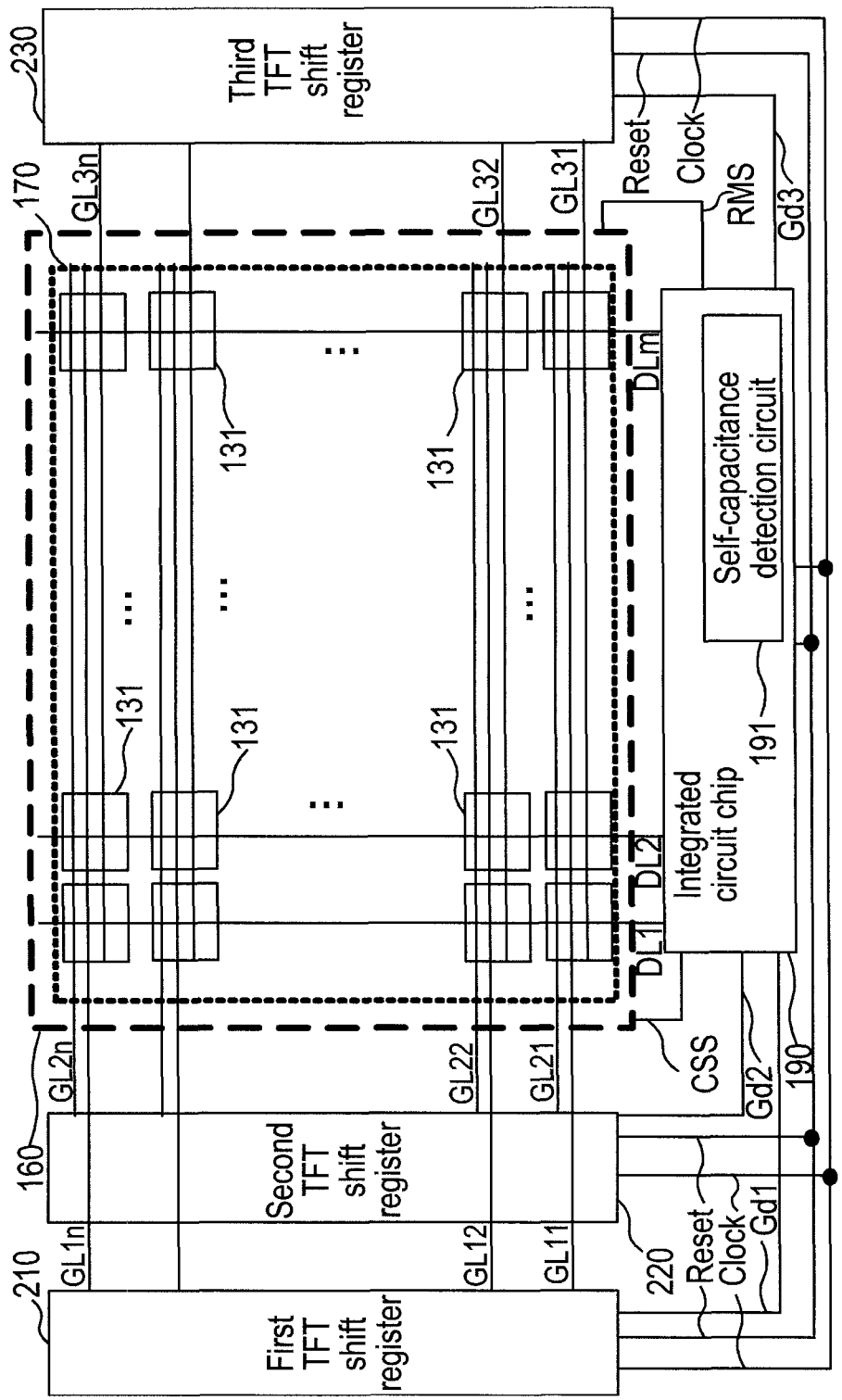
FIG. 1 is a schematic diagram of an interference-free fingerprint identification device in accordance with a first embodiment of the present disclosure.

The present disclosure relates to an interference-free fingerprint identification device. FIG. 1 is a schematic diagram of an interference-free fingerprint identification device 100 in accordance with a first embodiment of the present disclosure. FIG. 2A and FIG. 2B are cross-sectional views of the interference-free fingerprint identification device 100 in accordance with a first embodiment of the present disclosure, wherein the insulation layers between the conductive layers are represented by spaces and are not specifically indicated. FIG. 2B is similar to FIG. 2A, except that a second shielding layer 170 is added. With reference to FIG. 1, FIG. 2A and FIG. 2B, the interference-free fingerprint identification device 100 includes a thin film transistor substrate 110, a thin film transistor layer 120, a sensing electrode layer 130, a gate line layer 140, a data line layer 150, a first shielding layer 160, and a second shielding layer 170.

The thin film transistor layer 120 is disposed on one side of the thin film transistor substrate 110 and includes plural thin film transistors (not shown). The thin film transistor substrate 110 is a polymer film substrate, a glass substrate, a sapphire substrate, a ceramic substrate, or a metal substrate.

The sensing electrode layer 130 includes plural fingerprint sensing electrodes 131, wherein each fingerprint sensing electrode 131 corresponds to a plurality of the thin film transistors (shown in FIG. 7), and is connected to sources or drains of at least two corresponding thin film transistors.

The gate line layer 140 includes plural gate lines (shown in FIG. 7), wherein at least two gate lines are electrically connected to gates of a plurality of the thin film transistors corresponding to a fingerprint sensing electrode.

The data line layer 150 includes plural data lines (shown in FIG. 7), wherein each data line is electrically connected to a source or drain of a thin film transistor in a plurality of the thin film transistors corresponding to a fingerprint sensing electrode.

The first shielding layer 160 is disposed between the gate line layer 140 and the data line layer 150, and electrically connected to a source or drain of a thin film transistor in a plurality of the thin film transistors corresponding to each fingerprint sensing electrode.

The second shielding layer 170 is disposed between the sensing electrode layer 130 and the data line layer 150, and made of transparent conductive material or opaque metal material, which is selected from the group consisting of ITO, IZO, gold, silver, copper, aluminum, molybdenum, tungsten, indium, tin, nickel, and an alloy thereof.

FIG. 3A and FIG. 3B are another cross-sectional views of the interference-free fingerprint identification device in accordance with a first embodiment of the present disclosure, wherein the insulation layers between the conductive layers are represented by spaces and are not specifically indicated. In comparison with FIG. 2A and FIG. 2B, FIG. 3A and FIG. 3B are each additionally provided with a black matrix layer (BM) 180. The black matrix layer 180 may be black color and disposed between the thin film transistor substrate 110 and the sensing electrode layer 130. The difference between FIGS. 3A and 3B and FIGS. 2A and 2B is that the thin film transistor substrate 110 is located at top in FIG. 3A and FIG. 3B. That is, in FIG. 3A and FIG. 3B, the thin film transistor substrate 110 may serve as a protective layer of the plural fingerprint sensing electrodes 131 in the sensing electrode layer 130 when the thin film transistor substrate 110 is made of a glass material having a sufficient hardness. The thin film transistor substrate 110 of FIG. 3A or FIG. 3B is particularly suitable for serving as the upper cover, the protective glass, or the protective film of the display screen.

Figures 4A, 4B:
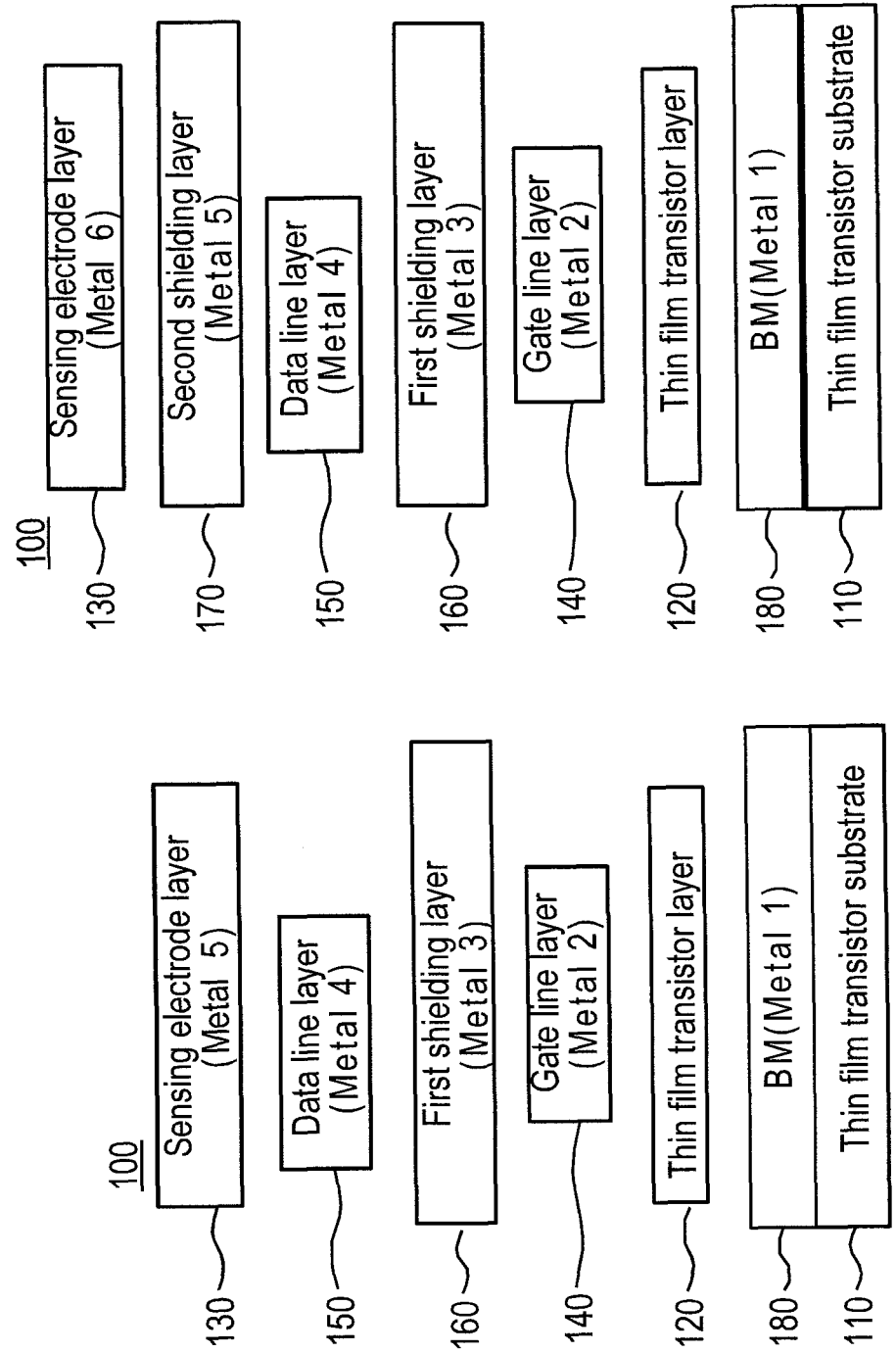
FIG. 4A and FIG. 4B are still another cross-sectional views of the interference-free fingerprint identification device in accordance with a first embodiment of the present disclosure.

FIG. 4A and FIG. 4B are still another cross-sectional views of the interference-free fingerprint identification device in accordance with a first embodiment of the present disclosure, wherein the insulation layers between the conductive layers are represented by spaces and are not specifically indicated. FIG. 4A and FIG. 4B are similar to FIG. 2A and FIG. 2B except that, in FIG. 4A and FIG. 4B, the gate line layer 140 is disposed above the thin film transistor layer 120, and a metal black matrix layer 180 is disposed between the thin film transistor substrate 110 and the thin film transistor layer 120.

FIG. 5A and FIG. 5B are yet another cross-sectional views of the interference-free fingerprint identification device in accordance with a first embodiment of the present disclosure, wherein the insulation layers between the conductive layers are represented by spaces and are not specifically indicated. FIG. 5A and FIG. 5B are similar to FIG. 2A and FIG. 2B except that, in FIG. 5A and FIG. 5B, the thin film transistor substrate 110 is a metal substrate, which produces a shielding effect and provides a possible application to a flexible or curved surface fingerprint detection.

Figures 6A, 6B:
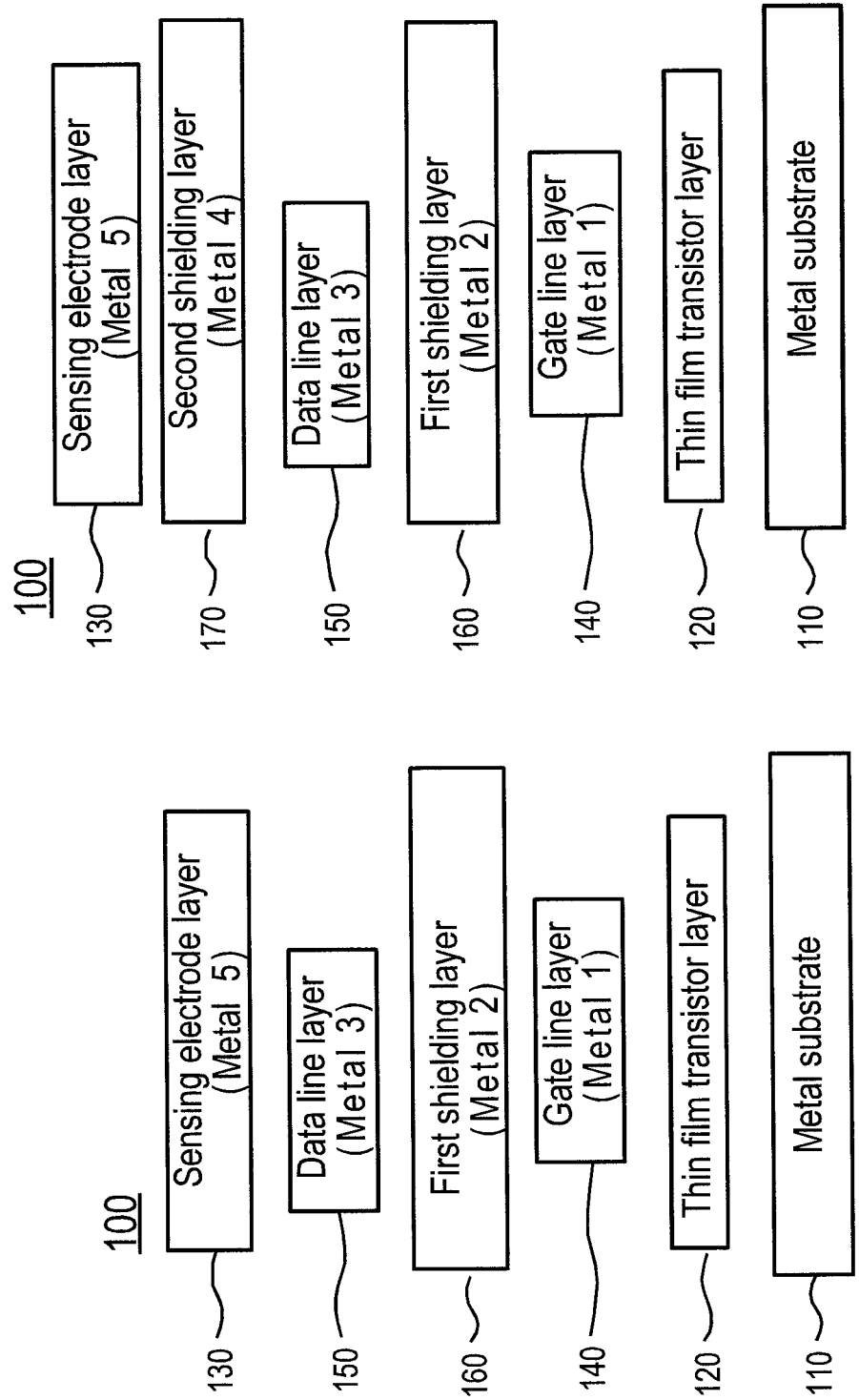
FIG. 6A and FIG. 6B are further another cross-sectional views of the interference-free fingerprint identification device in accordance with a first embodiment of the present disclosure.

FIG. 6A and FIG. 6B are further another cross-sectional views of the interference-free fingerprint identification device in accordance with a first embodiment of the present disclosure, wherein the insulation layers between the conductive layers are represented by spaces and are not specifically indicated. FIG. 6A and FIG. 6B are similar to FIG. 4A and FIG. 4B except that, in FIG. 6A and FIG. 6B, there is no black matrix layer and the thin film transistor substrate 110 is a metal substrate for producing a shielding effect and providing a possible application to a flexible or curved surface fingerprint detection.

Figure 7:
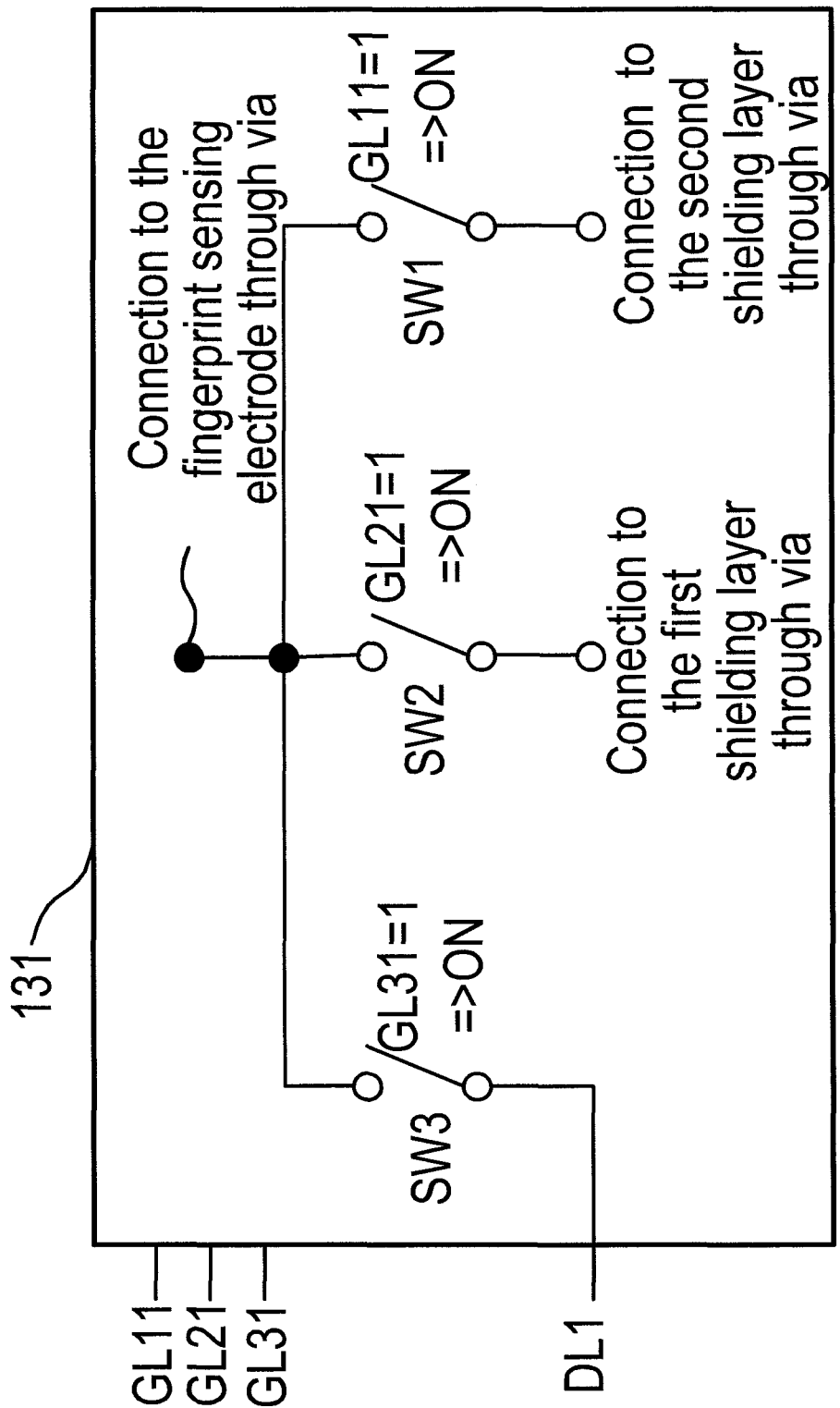
FIG. 7 is a schematic diagram of a fingerprint sensing electrode and corresponding thin film transistors in accordance with a first embodiment of the present disclosure.

FIG. 7 is a schematic diagram of a fingerprint sensing electrode and corresponding thin film transistors in accordance with a first embodiment of the present disclosure. The fingerprint sensing electrode 131 is disposed in the sensing electrode layer 130, and the corresponding thin film transistors are disposed in the thin film transistor layer 120. As shown in FIG. 7, one fingerprint sensing electrode 131 is corresponding to the three thin film transistors SW1, SW2 and SW3. Through the control of the gate lines GL11, GL21 and GL31, the fingerprint sensing electrode 131 can be controlled to be electrically connected to the data line DL1, the first shielding layer 160, or the second shielding layer 170. That is, each data line (DL1, DL2, . . . , DLm) is electrically connected to a source or drain of a thin film transistor SW3 in a plurality of the thin film transistors (SW1, SW2 and SW3) corresponding to the fingerprint sensing electrode 131. The second shielding layer 170 is electrically connected to a source or drain of a thin film transistor SW1 in a plurality of the thin film transistors (SW1, SW2 and SW3) corresponding to a fingerprint sensing electrode 131. The first shielding layer 160 is electrically connected to a source or drain of a thin film transistor SW2 in a plurality of the thin film transistors (SW1, SW2 and SW3) corresponding to each fingerprint sensing electrode 131.

Figure 8:
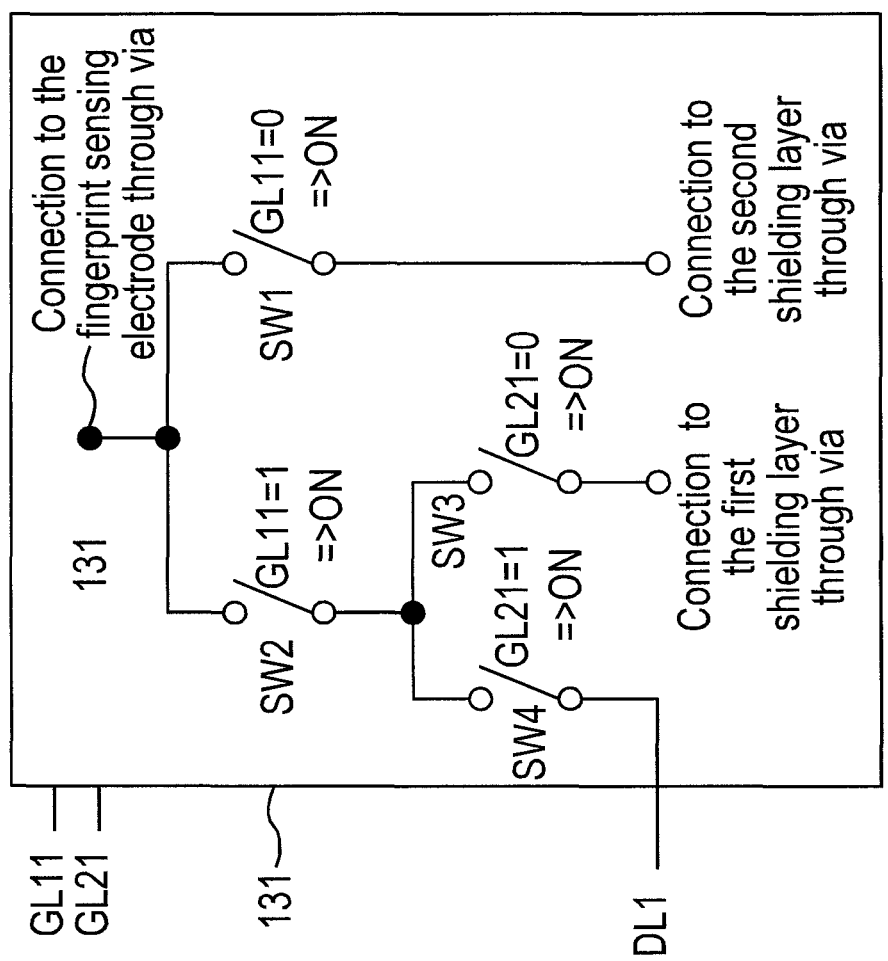
FIG. 8 is another schematic diagram of a fingerprint sensing electrode and corresponding thin film transistors in accordance with a first embodiment of the present disclosure.

FIG. 8 is another schematic diagram of a fingerprint sensing electrode and corresponding thin film transistors in accordance with a first embodiment of the present disclosure. The fingerprint sensing electrode 131 is disposed in the sensing electrode layer 130, and the corresponding thin film transistors are disposed in the thin film transistor layer 120. As shown in FIG. 8, one fingerprint sensing electrode 131 is corresponding to four thin film transistors SW1, SW2, SW3 and SW4. Through the control of the gate lines GL11 and GL21, the fingerprint sensing electrode 131 can be controlled to be electrically connected to the data line DL1, the first shielding layer 160, or the second shielding layer 170. It is noted that the fingerprint sensing electrode 131 is only directly connected to the thin film transistors SW1 and SW2, and is indirectly connected to the film transistors SW3 and SW4 through the thin film transistor SW2.

Figure 9:
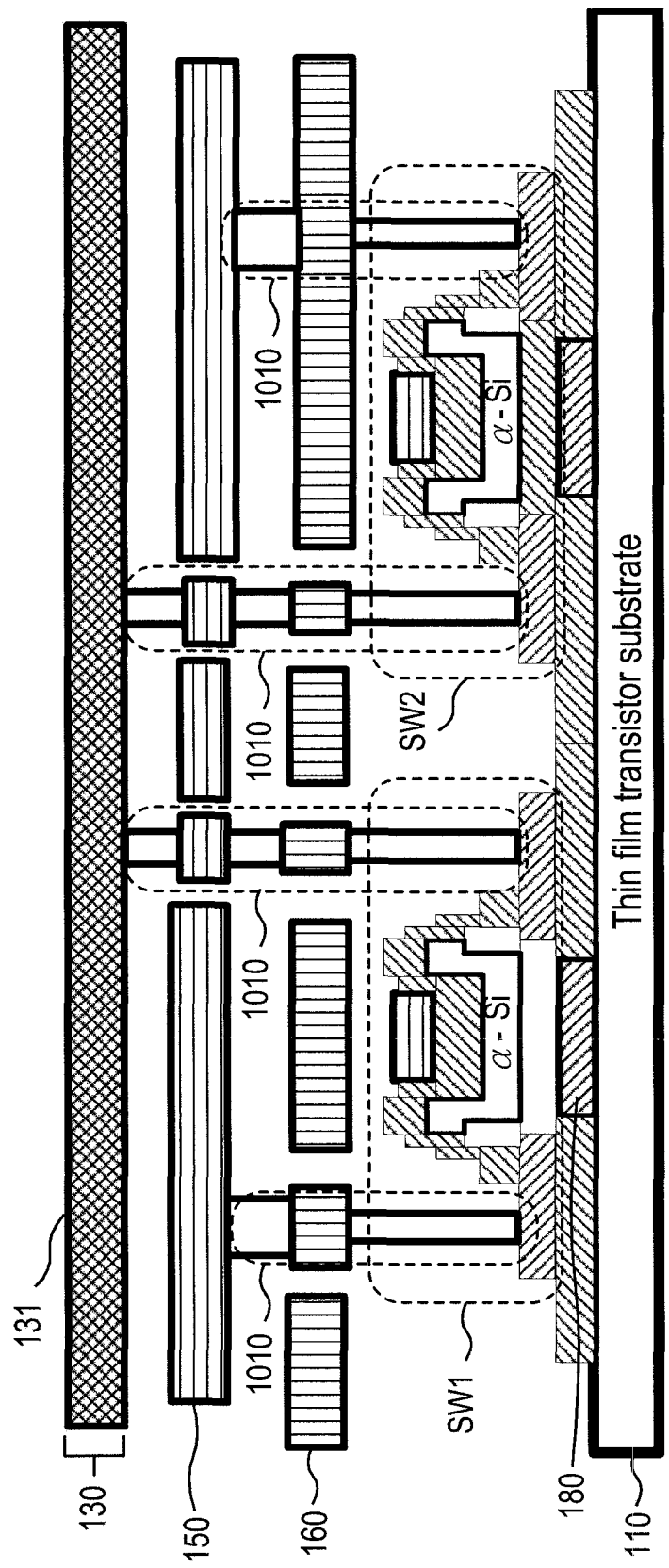
FIG. 9 is a detailed cross-sectional view of FIG. 4A in accordance with a first embodiment of the present disclosure.

FIG. 9 is a detailed cross-sectional view of FIG. 4A in accordance with a first embodiment of the present disclosure, in which the fingerprint sensing electrode 131 and the corresponding thin film transistors SW1 and SW2 of FIG. 8 are depicted, while the thin film transistors SW3 and SW4 corresponding to the fingerprint sensing electrode 131 are not shown. As shown in FIG. 9, the fingerprint sensing electrode 131 is electrically connected to the sources or drains of the thin film transistors SW1 and SW2 through the data line layer (Metal 4) 150, the via 1010, and first shielding layer (Metal 3) 160. The data line of the data line layer (Metal 4) 150 is also electrically connected to the sources or drains of the thin film transistors SW1 and SW2 through the via 1010.

Figure 10:
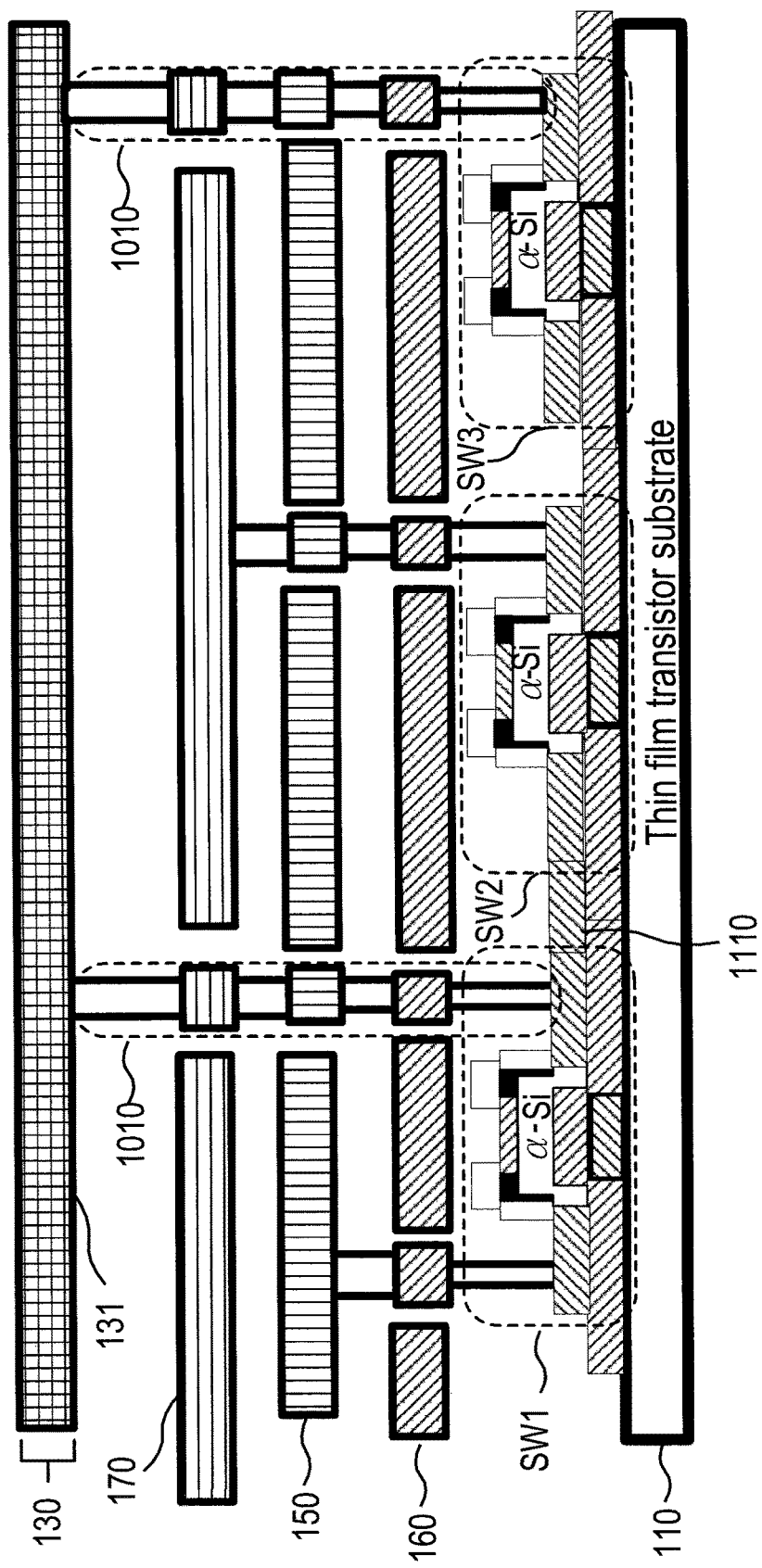
FIG. 10 is a detailed cross-sectional view of FIG. 2B in accordance with a first embodiment of the present disclosure.

FIG. 10 is a detailed cross-sectional view of FIG. 2B in accordance with a first embodiment of the present disclosure, in which the fingerprint sensing electrode 131 and the corresponding thin film transistors SW1, SW2 and SW3 of FIG. 7 are depicted. As shown in FIG. 10, the fingerprint sensing electrode 131 is electrically connected to the sources or drains of the thin film transistors SW1, SW2 and SW3 through the via 1010, the second shielding layer (Metal 4) 170, the data line layer (Metal 3) 150, and first shielding layer (Metal 2) 160. At the same time, in order to reduce the number of vias, the sources or drains of the thin film transistors SW1 and SW2 are electrically connected together by metal 1110 in the gate line layer 140 for being connected to the fingerprint sensing electrode 131 through the via 1110. Since the thin film transistors SW1 and SW2 can be controlled by the gate lines GL11 and GL21, only one of the thin film transistors SW1 and SW2 is turned on at the same time, thereby achieving a normal operation.

Figure 11:
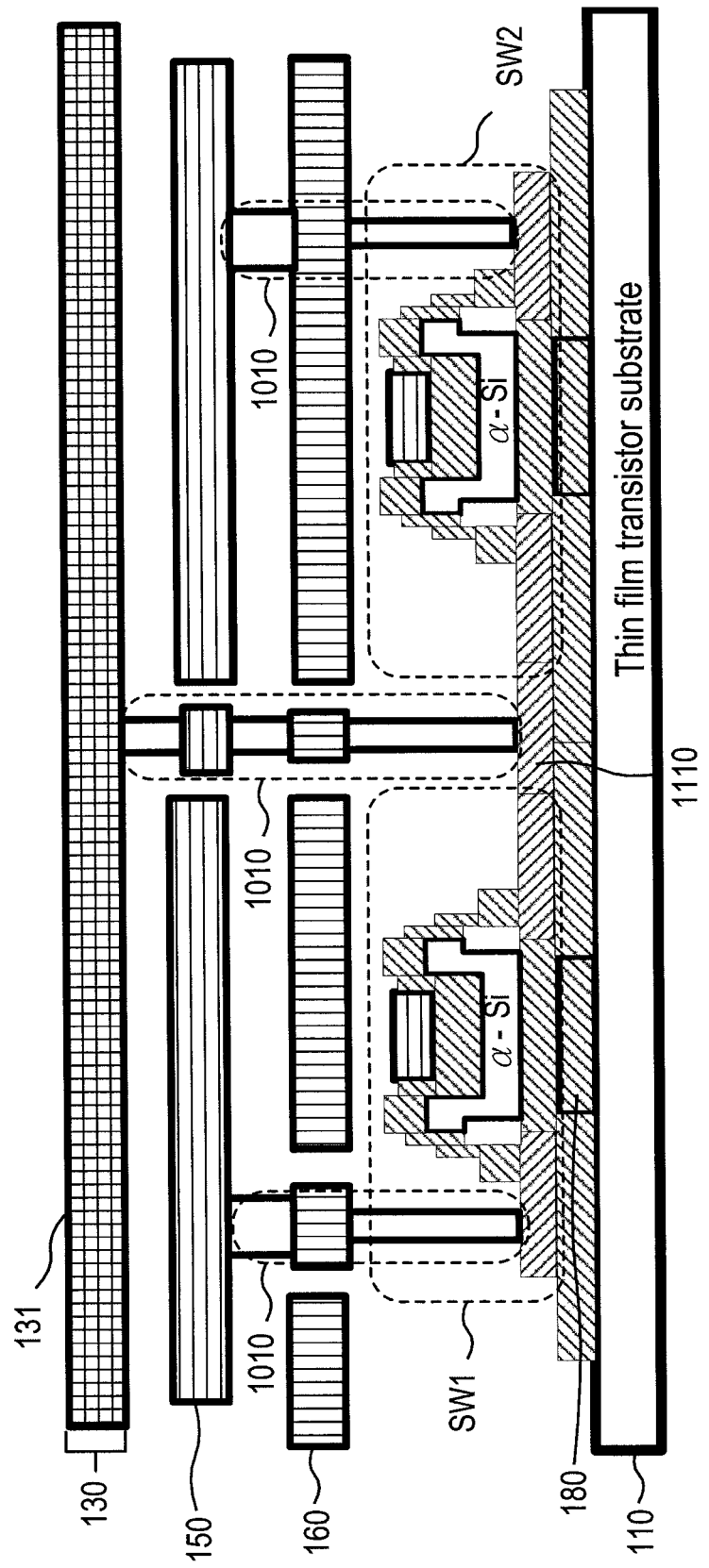
FIG. 11 is a detailed cross-sectional view of FIG. 4A in accordance with a first embodiment of the present disclosure.

FIG. 11 is a detailed cross-sectional view of FIG. 4A in accordance with a first embodiment of the present disclosure, which is similar to FIG. 9 except that, in FIG. 11, the sources or drains of the thin film transistors SW1 and SW2 are electrically connected together through the metal 1110 in the gate line layer 140, and then electrically connected to the fingerprint sensing electrode 131 through the via 1010 for reducing the number of vias.

Figure 12:
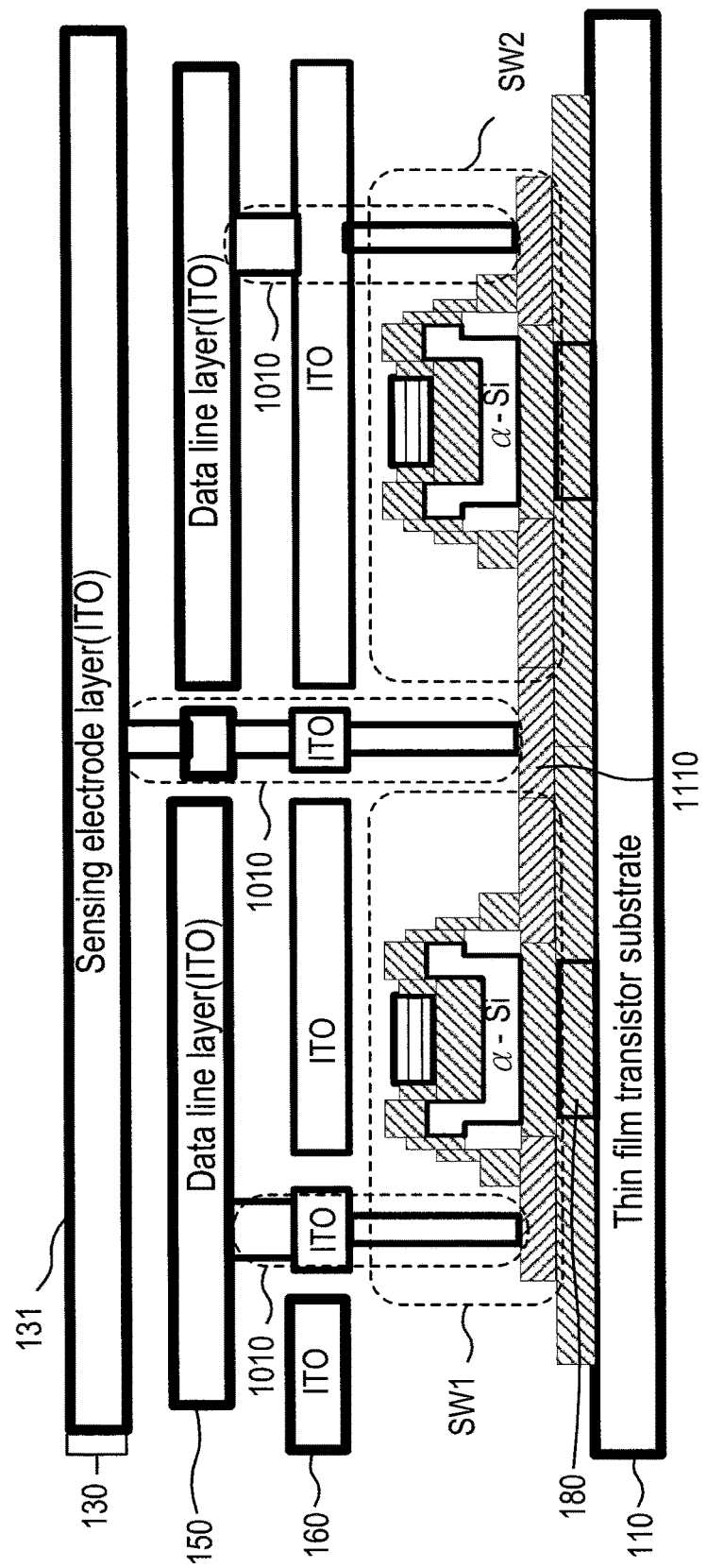
FIG. 12 is another detailed cross-sectional view of FIG. 4A in accordance with a first embodiment of the present disclosure.

FIG. 12 is another detailed cross-sectional view of FIG. 4A in accordance with a first embodiment of the present disclosure, which is similar to FIG. 11 except that, in FIG. 12, the sensing electrode layer 130, the data line layer 150 and the first shielding layer 160 may be made of transparent conductive material instead of the prior metal material.

With reference to FIG. 1, the interference-free fingerprint identification device 100 further includes an integrated circuit chip 190, a first TFT shift register 210, a second TFT shift register 220, and a third TFT shift register 230. The integrated circuit chip 190 includes at least one self-capacitance detection circuit 191. The integrated circuit chip 190 can directly or indirectly output control signals to the gate lines, output a capacitive stimulating signal to the data lines, and read fingerprint sensing signal from the at least one self-capacitance detection circuit 191 through at least a data line.

As shown in FIG. 1, the gate lines GL11, GL12, . . . , GL1n are connected to the first TFT shift register 210. The gate line GL11 is electrically connected to the gates of the thin film transistors corresponding to the finger sensing electrodes 131 of the first row, the gate line GL12 is electrically connected to the gates of the thin film transistors corresponding to the finger sensing electrodes 131 of the second row, and so on. That is, the gate line GL1n is electrically connected to the gates of the thin film transistors corresponding to the finger sensing electrodes 131 of the n-th row. Similarly, the gate lines GL21, GL22, . . . , GL2n are connected to the second TFT shift register 220 and the gates of the associated thin film transistors. The gate lines GL31, GL32, . . . , GL3n are connected to the third TFT shift register 230 and the gates of the associated thin film transistors.

The data line DL1 is electrically connected to the sources or drains of thin film transistors corresponding to the sensing electrodes 131 of the first column, the data line DL2 is electrically connected to the sources or drains of thin film transistors corresponding to the sensing electrodes 131 of the second column, and so on. That is, the data line DLm is electrically connected to the sources or drains of thin film transistors corresponding to the sensing electrodes 131 of the m-th column. The gate lines are substantially perpendicular to the data lines.

As shown in FIG. 1 and FIG. 7, the integrated circuit chip 190 outputs the control signals Gd1, Gd2 and Gd3 to the first TFT shift register 210, the second TFT shift register 220 and the third TFT shift register 230, respectively. The first TFT shift register 210 performs a shift operation on the control signal Gd1, and sequentially outputs signals to the gate lines GL11, GL12, . . . , GL1n and the gates of the TFTs corresponding to the sensing electrodes 131 of the first to n-th rows, so as to control the TFTs to be turned on/off.

Similarly, the second TFT shift register 220 performs a shift operation on the control signal Gd2, and sequentially outputs the signal to the gate lines GL21, GL22, . . . , GL2n and the gates of the TFTs corresponding to the sensing electrodes 131 of the first to n-th rows, so as to control the TFTs to be turned on/off. The third TFT shift register 220 performs a shift operation on the control signal Gd3, and sequentially outputs the signal to the gate lines GL31, GL32, . . . , GL3n and the gates of the TFTs corresponding to the sensing electrodes 131 of the first to n-th rows, so as to control the TFTs to be turned on/off.

The integrated circuit chip 190 sequentially outputs a capacitive stimulating signal to the data lines DL1, DL2, . . . , DLm, reads a fingerprint sensing signal from at least a data line and sends the fingerprint sensing signal to the self-capacitance detection circuit 191. The integrated circuit chip 190 further outputs a reflection shielding signal (RSS) and a convergence stabilization signal (CSS) to the first shielding layer 160 and the second shielding layer 170, respectively. As shown in FIG. 1 and FIG. 7, through the control of the gate lines GL11, GL12, . . . , GL1n, GL21, GL22, . . . , GL2n, GL31, GL32, . . . , GL3n, a fingerprint sensing electrode 131 may be provided with a capacitive stimulating signal, a reflection shielding signal (RSS), or a convergence stabilization signal (CSS) thereon.

In other embodiments, the integrated circuit chip 190 sequentially outputs a capacitive stimulating signal to the data lines DL1, DL2, . . . , DLm, reads a fingerprint sensing signal from at least one data line, and sends the fingerprint sensing signal to the self-capacitance detection circuit 191. The integrated circuit chip 190 further outputs a reflection shielding signal (RSS) to the first shielding layer 160 and the second shielding layer 170.

In other embodiments, the integrated circuit chip 190 sequentially outputs a capacitive stimulating signal to the data lines DL1, DL2, . . . , DLm, reads a fingerprint sensing signal from at least one data line, and sends the fingerprint sensing signal to the self-capacitance detection circuit 191. The integrated circuit chip 190 further outputs a reflection shielding signal (RSS) and a convergence stabilization signal (CSS) to the second shielding layer 170 and the first shielding layer 160, respectively.

Figure 13:
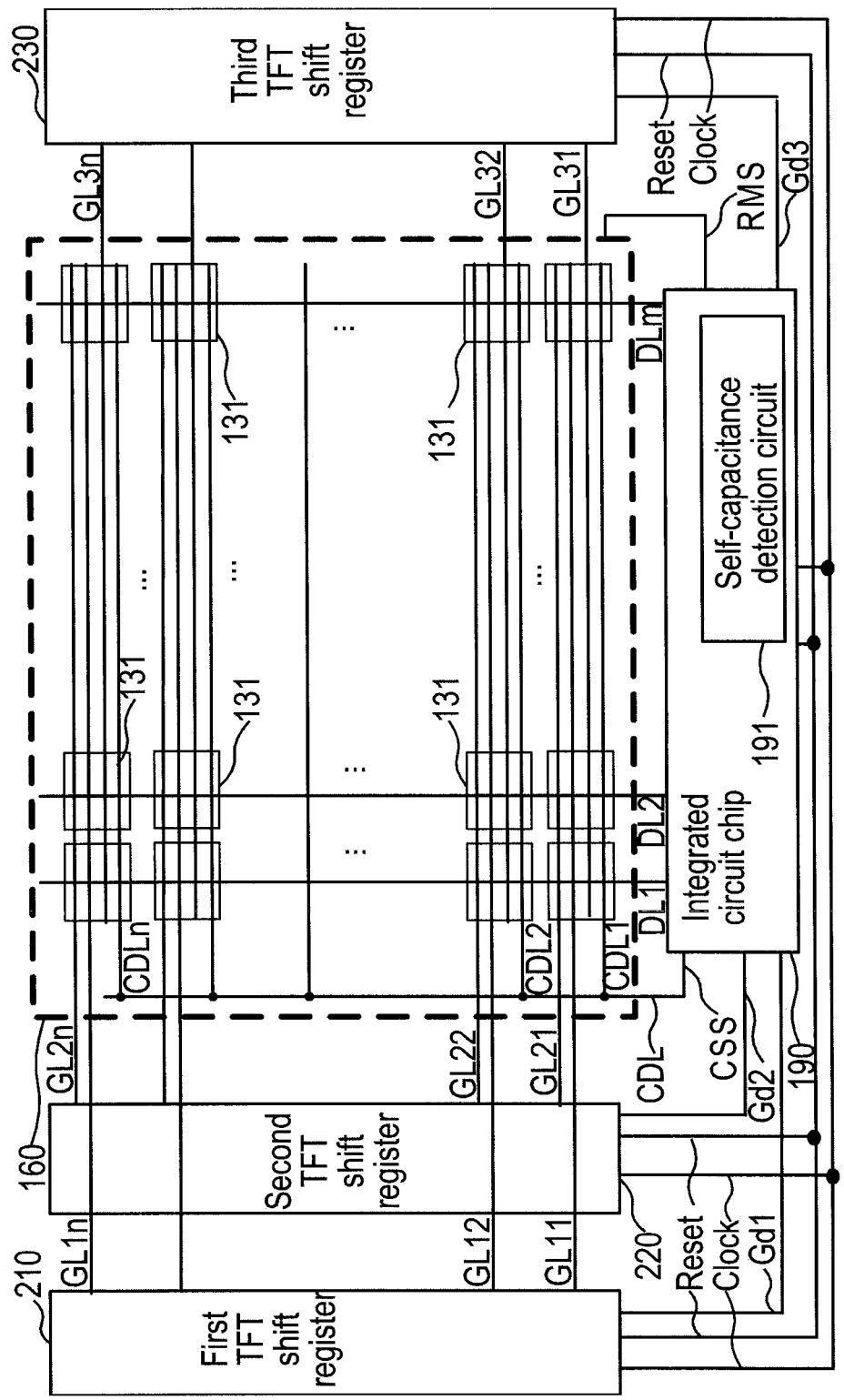
FIG. 13 is a schematic diagram of an interference-free fingerprint identification device in accordance with a second embodiment of the present disclosure.

FIG. 13 is a schematic diagram of an interference-free fingerprint identification device in accordance with a second embodiment of the present disclosure. This embodiment is similar to that of FIG. 1 except that the second shielding layer 170 is removed in FIG. 13. Plural common data lines CDL1, CDL2, . . . , CDLn are arranged in the gate line layer 140, which are parallel with the gate lines GL11, GL12, . . . , GL1n, GL21, GL22, . . . , GL2n, GL31, GL32, . . . , GL3n. The common data line CDL1 is electrically connected to the sources or drains of a plurality of the thin film transistors corresponding to the fingerprint sensing electrodes 131 of the first row, the common data line CDL2 is electrically connected to the sources or drains of a plurality of the thin film transistors corresponding to the finger sensing electrodes 131 of the second row, and so on. The plural common data lines CDL1, CDL2, CDLn are electrically connected together, and the integrated circuit chip 190 outputs a convergence stabilization signal (CSS) to the plural common data lines CDL1, CDL2, CDLn. Thus, a fingerprint sensing electrode 131 may be provided with a capacitive stimulating signal, a reflection shielding signal (RSS), or a convergence stabilization signal (CSS). Since the first shielding layer 160 is disposed between the gate line layer 140 and the data line layer 150, the signals on the common data lines CDL1, CDL2, CDLn and the gate lines GL1n, GL21, GL22, GL2n, GL31, GL32, GL3n can be shielded by the first shielding layer 160 so as not to affect the signals on the data lines DL1, DL2, DLm disposed in the data line layer 150.

Figure 14:
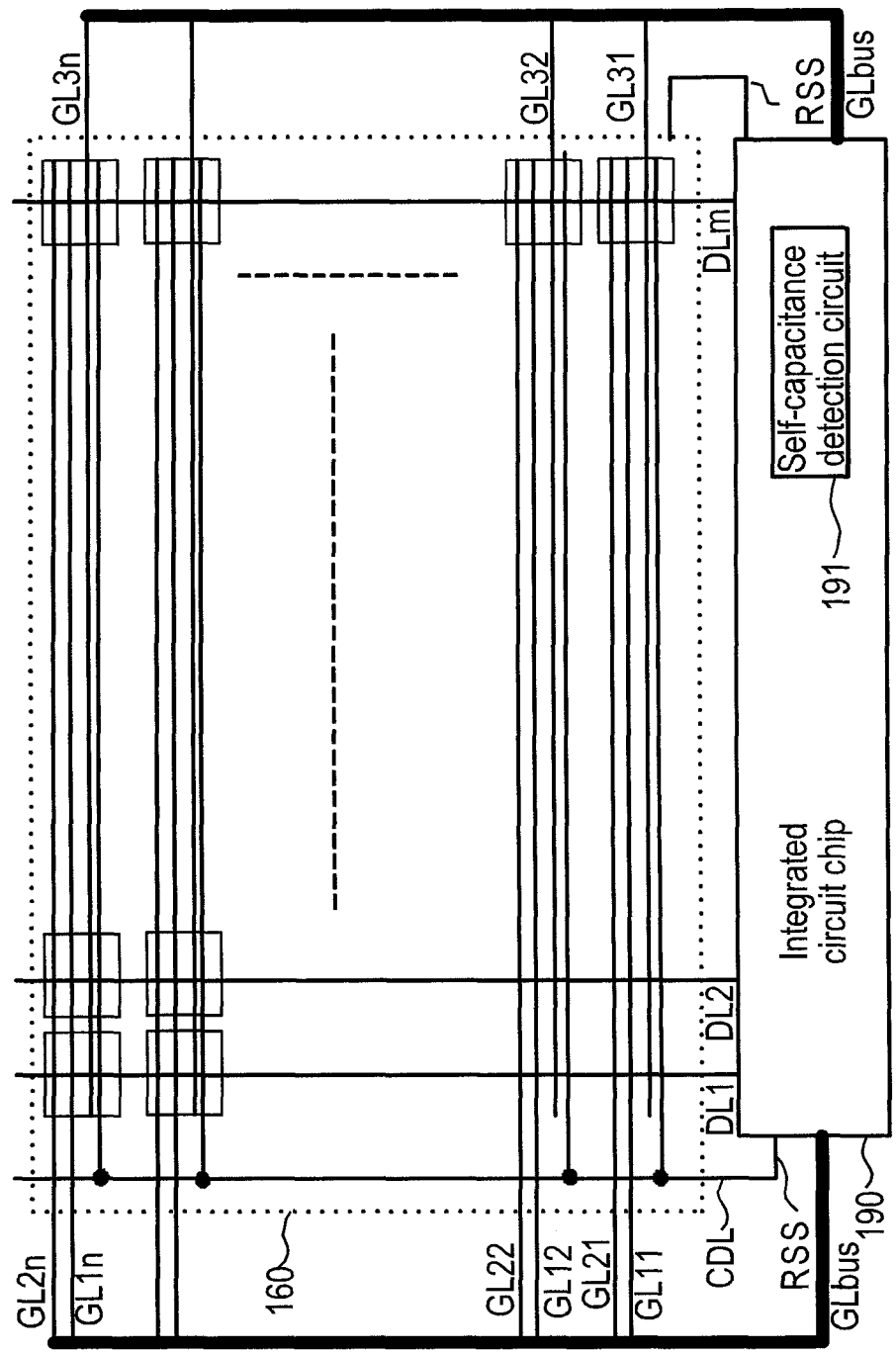
FIG. 14 is a schematic diagram of an interference-free fingerprint identification device in accordance with a third embodiment of the present disclosure.

FIG. 14 is a schematic diagram of an interference-free fingerprint identification device 100 in accordance with a third embodiment of the present disclosure. This embodiment is similar to that of FIG. 13 except that the first TFT shift register 210, the second TFT shift register 220 and the third TFT shift register 230 are removed in FIG. 14. The integrated circuit chip 190 directly outputs a control signal to the gate lines GL11, GL12, GL1n, GL21, GL22, GL2n, GL31, GL32, GL3n, CDL1, CDL2, . . . , CDLn through a gate line bus GLBus. Plural common data lines CDL1, CDL2, CDLn are disposed in the gate line layer 140. The common data line CDL1 is electrically connected to the sources or drains of a plurality of the thin film transistors corresponding to the fingerprint sensing electrodes 131 of the first row, the common data line CDL2 is electrically connected to the sources or drains of a plurality of the thin film transistors corresponding to the finger sensing electrodes 131 of the second row, and so on. The plural common data lines CDL1, CDL2, CDLn are electrically connected together, and the integrated circuit chip 190 outputs a reflection shielding signal (RSS) to the plural common data lines CDL1, CDL2, CDLn. Thus, a fingerprint sensing electrode 131 may be provided with a capacitive stimulating signal, or a reflection shielding signal (RSS). Since the first shielding layer 160 is disposed between the gate line layer 140 and the data line layer 150, the signals on the common data lines CDL1, CDL2, CDLn and the gate lines GL1n, GL21, GL22, GL2n, GL31, GL32, GL3n can be shielded by the first shielding layer 160 so as not to affect the signals on the data lines DL1, DL2, DLm disposed in the data line layer 150.

Figure 15:
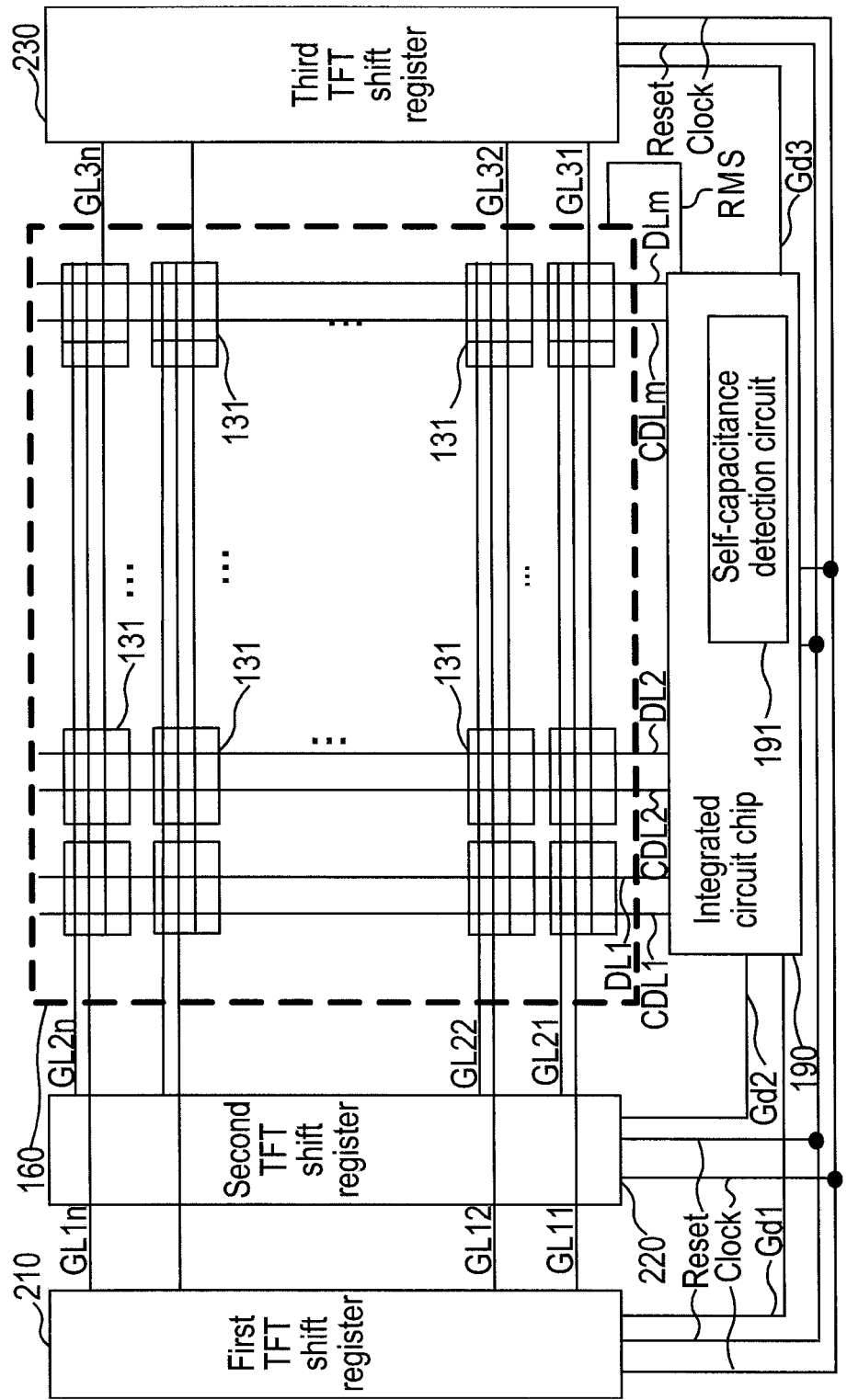
FIG. 15 is a schematic diagram of an interference-free fingerprint identification device in accordance with a fourth embodiment of the present disclosure.

FIG. 15 is a schematic diagram of an interference-free fingerprint identification device in accordance with a fourth embodiment of the present disclosure. This embodiment is similar to that of FIG. 13 except that the plural common data lines CDL1, CDL2, CDLn are removed in the gate line layer 140 and are disposed in the data line layer 150 in FIG. 15, wherein the plural common data lines CDL1, CDL2, CDLn are parallel with the data lines DL1, DL2, DLm. The common data line CDL1 is electrically connected to the sources or drains of a plurality of the thin film transistors corresponding to the first column fingerprint sensing electrodes 131, the common data line CDL2 is electrically connected to the sources or drains of a plurality of the thin film transistors corresponding to the second column finger sensing electrodes 131, and so on. The integrated circuit chip 190 outputs a reflection shielding signal (RSS) to the plural common data lines CDL1, CDL2, CDLn. Thus, a fingerprint sensing electrode 131 may be provided with a capacitive stimulating signal or a reflection shielding signal (RSS). Since the first shielding layer 160 is disposed between the gate line layer 140 and the data line layer 150, the signals on the gate lines GL1n, GL21, GL22, GL2n, GL31, GL32, GL3n can be shielded by the first shielding layer 160 so as not to affect the signals on the data lines DL1, DL2, DLm and the common data lines CDL1, CDL2, CDLn disposed in the data line layer 150.

From the aforementioned, the sensing electrodes 131 of the sensing electrode layer 130, the gate lines, the data lines, and the first shielding layer 160 are made of transparent conductive material or opaque metal material, which is selected from the group consisting of ITO, IZO, gold, silver, copper, aluminum, molybdenum, tungsten, indium, tin, nickel, and an alloy thereof.

Figure 16A:
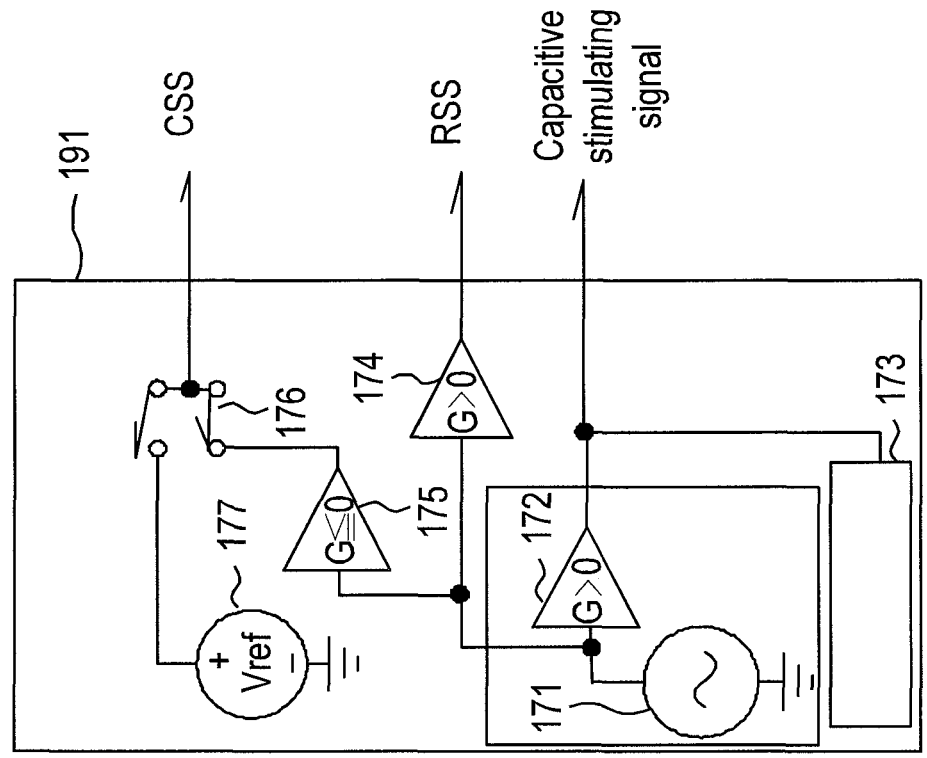
FIG. 16A is a circuit diagram of a self-capacitance detection circuit in accordance with the present disclosure.

FIG. 16A is a circuit diagram of a self-capacitance detection circuit in accordance with the present disclosure. As shown in FIG. 16A, the self-capacitance detection circuit 191 includes a capacitive stimulating signal generator 171, a first amplifier 172, a capacitance read circuit 173, a second amplifier 174, a third amplifier 175, a switch 176, and a reference voltage generator 177. The gain of the first amplifier 172 is greater than 0 and is preferably equal to 1, so as to amplify the capacitive stimulating signal generated by the capacitive stimulating signal generator 171. The gain of the second amplifier 174 is greater than 0 and is preferably equal to 1, and the gain of the third amplifier 175 is smaller than or equal to zero. The second amplifier 174 generates the reflection shielding signal (RSS) based on the capacitive stimulating signal, wherein a phase of the reflection shielding signal (RSS) is the same as a phase of the capacitive stimulating signal. The third amplifier 175 generates the convergence stabilization signal (CSS) based on the capacitive stimulating signal, wherein a phase of the convergence stabilization signal (CSS) is reverse to a phase of the capacitive stimulating signal. The convergence stabilization signal (CSS) may also be a specific DC reference potential, for example a zero potential.

The capacitive stimulating signal is a periodic or non-periodic alternating signal. The capacitive detection circuit 191 outputs the capacitive stimulating signal to a fingerprint sensing electrode 131 which returns a fingerprint sensing signal (FSS) to the capacitance read circuit 173 when a finger touches the finger sensing electrode 131. The capacitance read circuit 173 can acquire the sensing voltage of the fingerprint sensing signal (FSS).

The phase of the reflection shielding signal (RSS) is the same as the phase of the capacitive stimulating signal or the phase of the fingerprint sensing signal. The phase of the convergence stabilization signal (CSS) is reverse to the phase of the capacitive stimulating signal or the phase of the fingerprint sensing signal, or the convergence stabilization signal (CSS) is a direct current reference level signal.

Figure 16B:
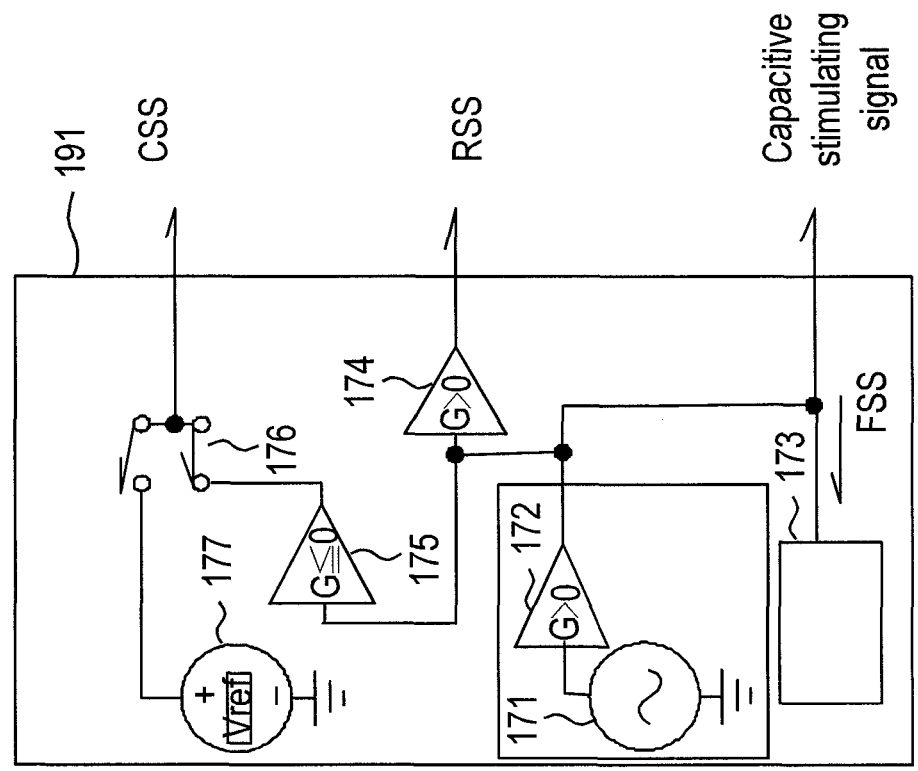
FIG. 16B is another circuit diagram of a self-capacitance detection circuit in accordance with the present disclosure.

FIG. 16B is another circuit diagram of a self-capacitance detection circuit in accordance with the present disclosure. As shown, based on the output signal of the capacitive stimulating signal generator 171, it generates the capacitive stimulating signal and the reflection shielding signal (RSS) with the same phase, and the convergence stabilization signal (CSS) with the reverse phase.

The integrated circuit chip 190 may output the capacitance stimulating signal to a fingerprint sensing electrode 131 for performing fingerprint sensing. In other embodiments, the plural data lines of the adjacent fingerprint sensing electrodes 131 may be electrically connected inside the integrated circuit chip 190. When the integrated circuit chip 190 outputs a capacitive stimulating signal, the plural adjacent fingerprint sensing electrodes 131 may form one larger fingerprint sensing electrode for performing fingerprint sensing.

Figure 17:
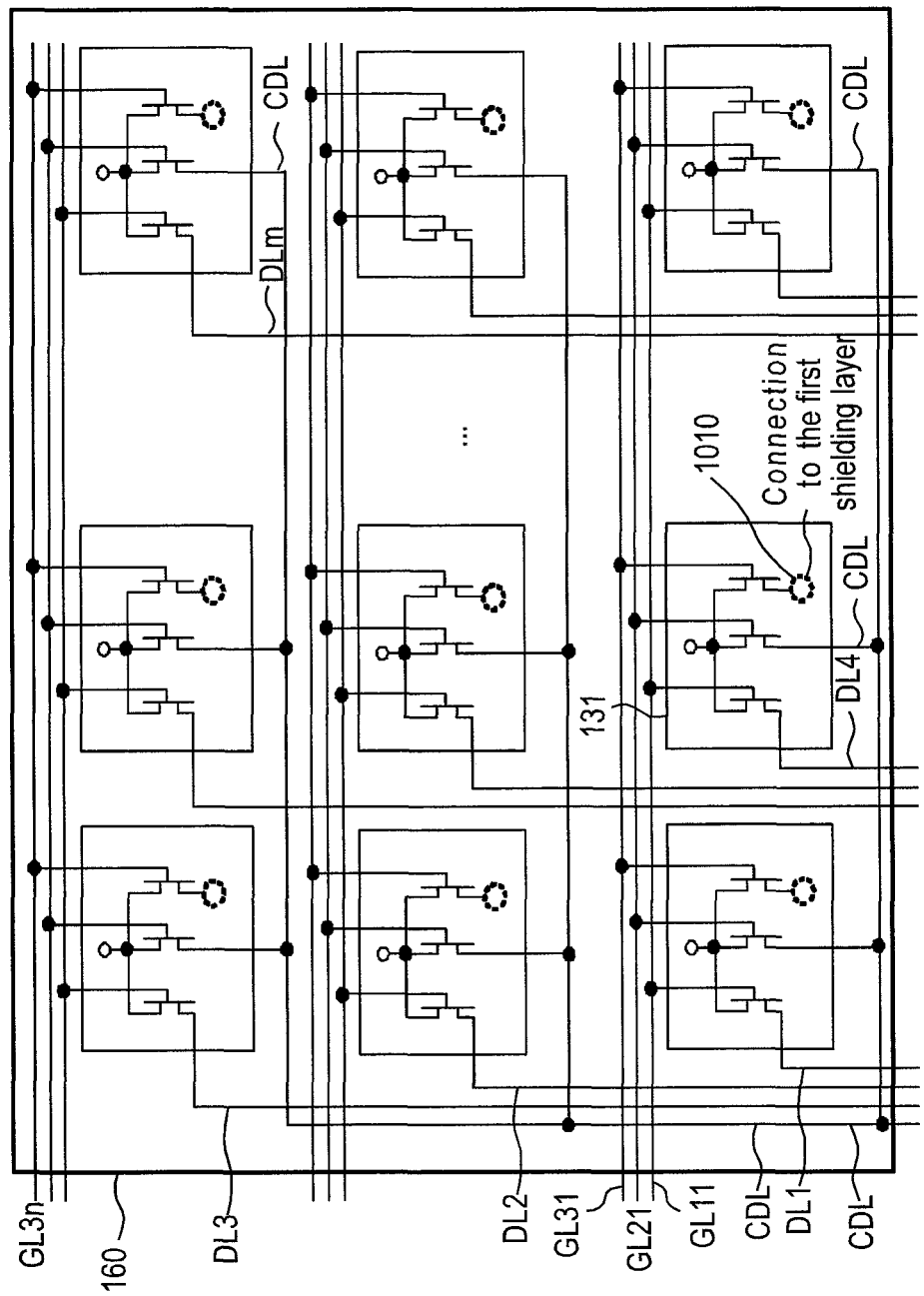
FIG. 17 is an application schematic diagram of an interference-free fingerprint identification device in accordance with the present disclosure.

FIG. 17 is an application schematic diagram of an interference-free fingerprint identification device in accordance with the present disclosure, which is corresponding to FIG. 14. As shown in FIG. 17, there are three rows of fingerprint sensing electrode 131 depicted. The fingerprint sensing electrode 131 may be electrically connected to the first shielding layer 160 through a via 1010. The fingerprint sensing electrode 131 may be electrically connected to the data line DL4, the first shielding layer 160, or the common data line CDL by the control of the gate lines GL11, GL21 and GL31. When the integrated circuit chip 190 outputs the capacitive stimulating signal, the reflection shielding signal (RSS) and the convergence stabilization signal (CSS) to the data line DL4, the first shielding layer 160 and the common data line CDL, respectively, one fingerprint sensing electrode 131 may be provided with the capacitive stimulating signal, the reflection shielding signal (RSS) or the convergence stabilization signal (CSS).

Figure 18:
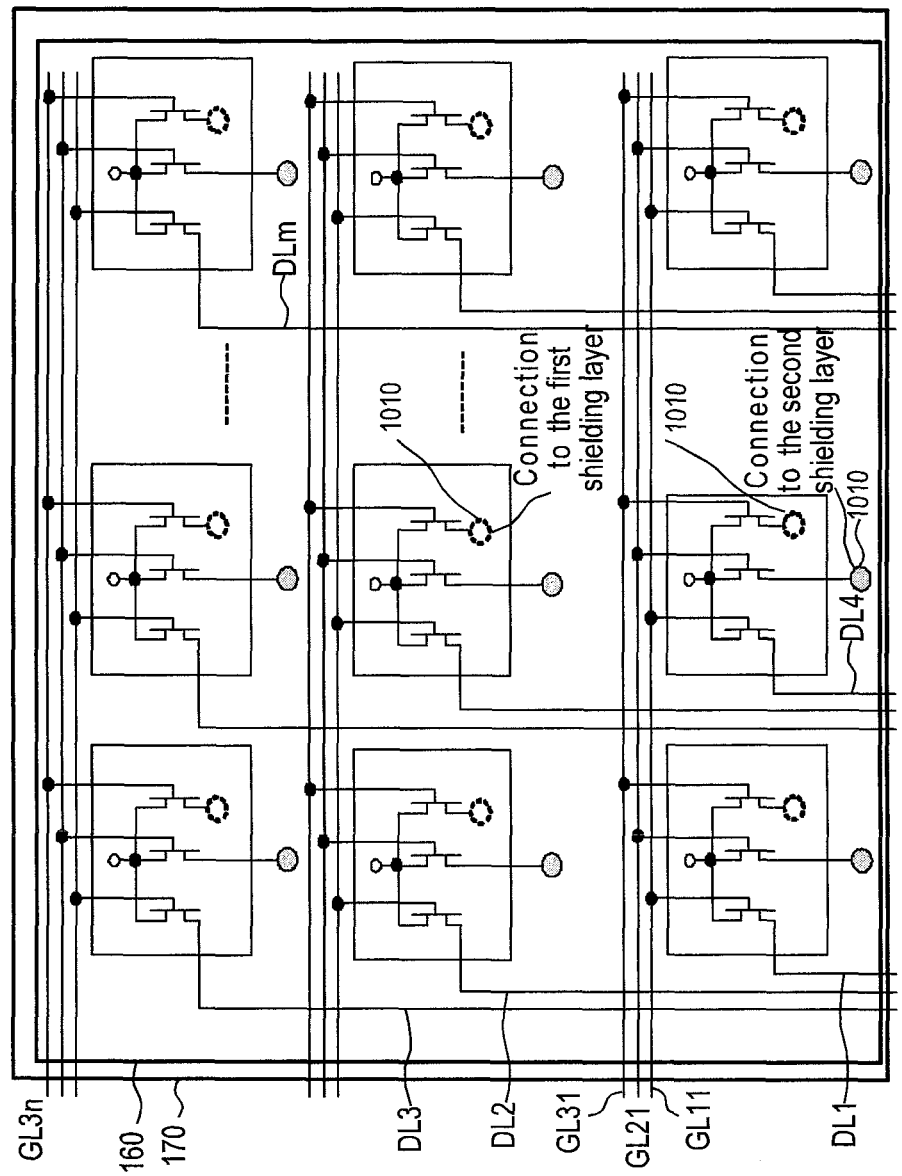
FIG. 18 is another application schematic diagram of an interference-free fingerprint identification device in accordance with the present disclosure.

FIG. 18 is another application schematic diagram of an interference-free fingerprint identification device in accordance with the present disclosure, which is corresponding to FIG. 1. As shown in FIG. 18, there are three rows of fingerprint sensing electrode 131 depicted. The fingerprint sensing electrode 131 is connected to the first shielding layer 160 and the second shielding layer 170 through the vias 1010. The fingerprint sensing electrode 131 may be electrically connected to the data line DL4, the first shielding layer 160 or the second shielding layer 170 by the control of the gate lines GL11, GL21, and GL31. When the integrated circuit chip 190 outputs the capacitive stimulating signal, the reflection shielding signal (RSS) and the convergence stabilization signal (CSS) to the data line DL4, the first shielding layer 160 and the second shielding layer 170, respectively, one fingerprint sensing electrode 131 may be provided with the capacitive stimulating signal, the reflection shielding signal (RSS) or the convergence stabilization signal (CSS).

Figure 19:
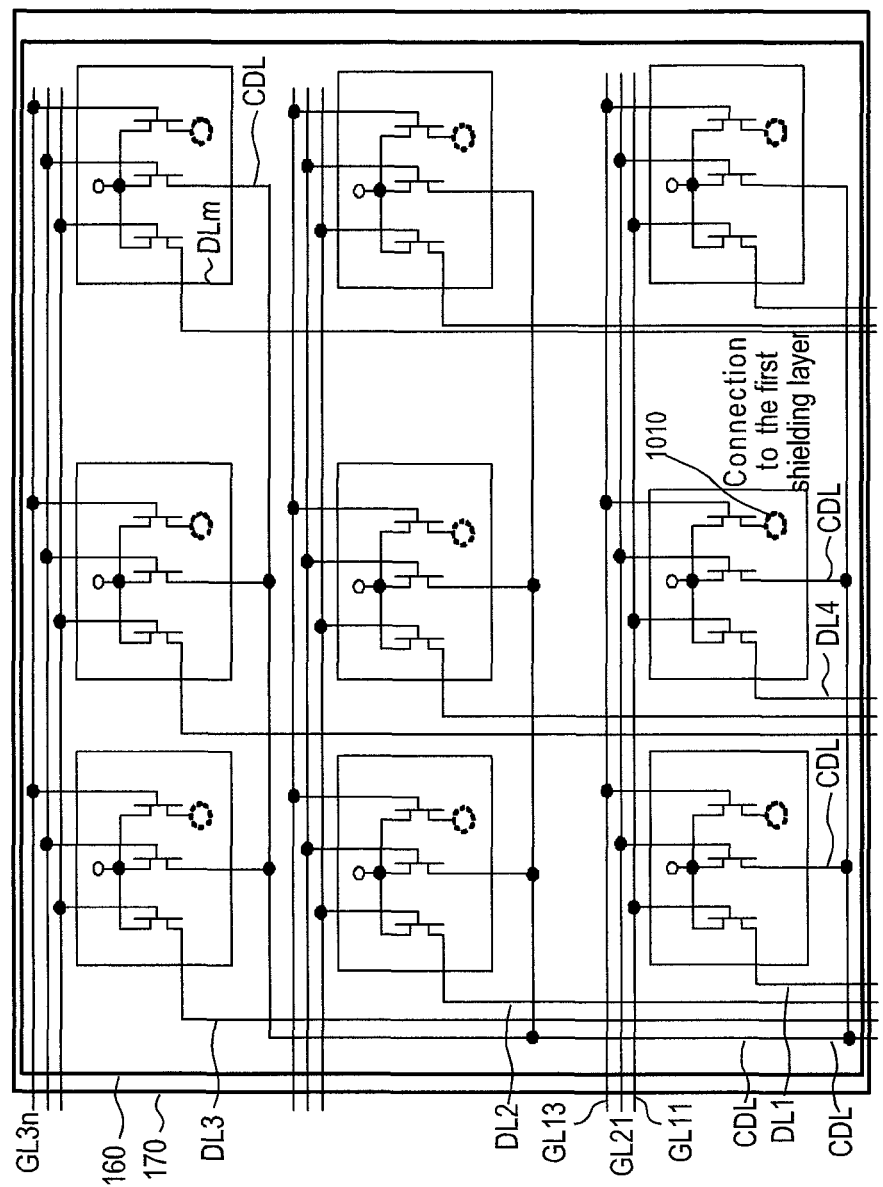
FIG. 19 is still another application schematic diagram of an interference-free fingerprint identification device in accordance with the present disclosure.

FIG. 19 is still another application schematic diagram of an interference-free fingerprint identification device in accordance with the present disclosure, which is corresponding to FIG. 1. As shown in FIG. 19, there are three rows of fingerprint sensing electrode 131 depicted. The fingerprint sensing electrode 131 is connected to the first shielding layer 160 by via 1010. The fingerprint sensing electrode 131 may be electrically connected to the data line DL4, the first shielding layer 160, or the common data line CDL by the control of the gate lines GL11, GL21 and GL31. When the integrated circuit chip 190 outputs the capacitive stimulating signal, the reflection shielding signal (RSS) and the convergence stabilization signal (CSS) to the data line DL4, the first shielding layer 160 and the second shielding layer 170, and the common data line CDL, respectively, one fingerprint sensing electrode 131 may be provided with the capacitive stimulating signal, the reflection shielding signal (RSS) or the convergence stabilization signal (CSS). At this moment, the first shielding layer 160 and the second shielding layer 170 are provided with the reflection shielding signal (RSS), and the data line layer 150 is sandwiched between the first shielding layer 160 and the second shielding layer 170 so as to effectively increase the shielding effect of the data line layer 150.

In view of the foregoing, by using the gate lines to control the gates of thin film transistors corresponding to the fingerprint sensing electrode 131, the fingerprint sensing electrode 131 may be provided with the capacitive stimulating signal, the reflection shielding signal (RSS) or the convergence stabilization signal (CSS). It can use one fingerprint sensing electrode 131 alone for performing fingerprint sensing. Plural adjacent fingerprint sensing electrodes 131 may also be electrically connected together to form a larger fingerprint sensing electrode for performing fingerprint sensing.

At the same time, in the present disclosure, when a capacitive stimulating signal is applied to a fingerprint sensing electrode 131, a reflection shielding signal (RSS) with the same phase can be applied to the adjacent fingerprint sensing electrodes around the fingerprint sensing electrode 131, thereby eliminating the stray capacitance between the fingerprint sensing electrode 131 and the adjacent fingerprint sensing electrodes. Moreover, the electric flux lines on the fingerprint sensing electrode 131 can be gathered and pushed upward so as to enhance the sensitivity, increase the effective sensing distance, improve the signal to noise ratio, and enhance the stability and accuracy of the sensing signal. In addition, the present disclose provides an interference-free fingerprint identification device with low cost and simple package. The thin film transistor switch technology is employed to form a thin film transistor layer on the substrate, wherein the thin film transistor layer includes plural thin film transistors. A fingerprint identification integrated circuit chip is electrically connected to the thin film transistor substrate, so as to not only reduce the chip area and simplify the packaging process, but also easily increase the sensing area and facilitate realization of curved surface sensing, thereby enhancing the accuracy of biometrics, significantly improving the manufacturing yield, and greatly reducing the production cost.

Although the present invention has been explained in relation to its preferred embodiment, it is to be understood that many other possible modifications and variations can be made without departing from the spirit and scope of the invention as hereinafter claimed.

What is claimed is:

1. An interference-free fingerprint identification device, comprising:
    a thin film transistor substrate;
    a thin film transistor layer disposed on one side of the thin film transistor substrate and including plural thin film transistors;
    a sensing electrode layer including plural fingerprint sensing electrodes, wherein each fingerprint sensing electrode corresponds to a plurality of the thin film transistors, and is connected to sources or drains of at least two corresponding thin film transistors;
    a gate line layer including plural gate lines, wherein at least two gate lines are electrically connected to gates of a plurality of the thin film transistors corresponding to a fingerprint sensing electrode;
    a data line layer including plural data lines, wherein each data line is electrically connected to a source or drain of a thin film transistor in a plurality of the thin film transistors corresponding to each of a plurality of fingerprint sensing electrodes; and a first shielding layer disposed between the gate line layer and the data line layer, and electrically connected to a source or drain of a thin film transistor in a plurality of the thin film transistors corresponding to each fingerprint sensing electrode.

2. The interference-free fingerprint identification device as claimed in claim 1, further comprising;
    a second shielding layer disposed between the sensing electrode layer and the data line layer, and made of transparent conductive material or opaque metal material, which is selected from the group consisting of ITO, IZO, gold, silver, copper, aluminum, molybdenum, tungsten, indium, tin, nickel, and an alloy thereof.

3. The interference-free fingerprint identification device as claimed in claim 2, wherein the second shielding layer is electrically connected to a source or drain of a thin film transistor in a plurality of the thin film transistors corresponding to each of a plurality of fingerprint sensing electrodes.

4. The interference-free fingerprint identification device as claimed in claim 1, wherein plural common data lines are disposed in the gate line layer, one common data line is electrically connected to a source or drain of a plurality of the thin film transistors, and the common data lines are electrically connected together.

5. The interference-free fingerprint identification device as claimed in claim 1, wherein the gate lines are substantially perpendicular to the data lines.

6. The interference-free fingerprint identification device as claimed in claim 1, wherein the sensing electrodes of the sensing electrode layer, the gate lines, the data lines, and the first shielding layer are made of transparent conductive material or opaque metal material, which is selected from the group consisting of ITO, IZO, gold, silver, copper, aluminum, molybdenum, tungsten, indium, tin, nickel, and an alloy thereof.

7. The interference-free fingerprint identification device as claimed in claim 1, further comprising:
    an integrated circuit chip including at least one self-capacitance detection circuit, directly or indirectly outputting control signals to the gate lines, outputting a capacitive stimulating signal to the data lines, and reading a fingerprint sensing signal from the at least one self-capacitance detection circuit by at least a data line.

8. The interference-free fingerprint identification device as claimed in claim 7, wherein the integrated circuit chip further outputs a reflection shielding signal, and a convergence stabilization signal.

9. The interference-free fingerprint identification device as claimed in claim 8, wherein the capacitive stimulating signal is a periodic or non-periodic alternating signal, and a phase of the reflection shielding signal is the same as a phase of the capacitive stimulating signal or a phase of the fingerprint sensing signal.

10. The interference-free fingerprint identification device as claimed in claim 8, wherein a phase of the convergence stabilization signal is reverse to a phase of the capacitive stimulating signal or a phase of the fingerprint sensing signal, or the convergence stabilization signal is a direct current reference level signal.

11. The interference-free fingerprint identification device as claimed in claim 8, wherein the integrated circuit chip outputs a reflection shielding signal to the first shielding layer.

12. The interference-free fingerprint identification device as claimed in claim 8, wherein the integrated circuit chip outputs a convergence stabilization signal to plural common data lines disposed in the gate line layer.

13. The interference-free fingerprint identification device as claimed in claim 8, wherein the integrated circuit chip outputs a reflection shielding signal to a second shielding layer disposed between the sensing electrode layer and the data line layer.

14. The interference-free fingerprint identification device as claimed in claim 13, wherein the integrated circuit chip further outputs a convergence stabilization signal to the first shielding layer.

15. The interference-free fingerprint identification device as claimed in claim 13, wherein the integrated circuit chip further outputs a reflection shielding signal to the first shielding layer.

16. The interference-free fingerprint identification device as claimed in claim 1, the thin film transistor substrate is a polymer film substrate, a glass substrate, a sapphire substrate, a ceramic substrate, or a metal substrate.

* * * * *